(12) United States Patent
Kurzeja

(10) Patent No.: US 10,903,160 B2
(45) Date of Patent: Jan. 26, 2021

(54) HOUSING FOR AN ELECTRONIC COMPONENT, IN PARTICULAR A SEMICONDUCTOR CHIP

(71) Applicant: Possehl Electronics Deutschland GmbH, Niefern (DE)

(72) Inventor: Dietmar Kurzeja, Niefern (DE)

(73) Assignee: POSSEHL ELECTRONICS DEUTSCHLAND GMBH, Niefern (DE)

( * ) Notice: Subject to any disclaimer, the term of this patent is extended or adjusted under 35 U.S.C. 154(b) by 0 days.

(21) Appl. No.: 16/373,537

(22) Filed: Apr. 2, 2019

(65) Prior Publication Data
US 2019/0229041 A1   Jul. 25, 2019

Related U.S. Application Data

(63) Continuation of application No. PCT/EP2017/025302, filed on Oct. 6, 2017.

(30) Foreign Application Priority Data

Oct. 6, 2016  (DE) .................. 10 2016 011 934
Oct. 6, 2016  (DE) .................. 20 2016 006 195 U

(51) Int. Cl.
*H01L 23/495*   (2006.01)
*H01L 23/498*   (2006.01)
(Continued)

(52) U.S. Cl.
CPC ........ *H01L 23/4985* (2013.01); *H01L 23/055* (2013.01); *H01L 23/10* (2013.01);
(Continued)

(58) Field of Classification Search
CPC ....... H01L 23/055; H01L 23/10; H01L 23/13; H01L 23/49838; H01L 23/4985; H01L 23/5387
(Continued)

(56) References Cited

U.S. PATENT DOCUMENTS 5,041,696 A   8/1991 Utner
6,300,679 B1  10/2001 Mukerji et al.
(Continued)

FOREIGN PATENT DOCUMENTS

DE   198 00 928 A1   4/1994
DE   692 09 772 T2   11/1996
(Continued)

*Primary Examiner* — Luan C Thai
(74) *Attorney, Agent, or Firm* — Hackler Daghighian Martino & Novak

(57) ABSTRACT

A housing for accommodating an electronic component of an electronic assembly includes a base and a cover, wherein the base and the cover are connected to one another by a hinge element and the base and the cover of the housing can be folded together by means of the hinge element. At least one leadframe has conductor tracks arranged in the housing, wherein at least one conductor track of the leadframe is arranged in the base of the housing and at least one further conductor track is arranged in the cover of the housing, and wherein the at least one further conductor track extends starting from the base of the housing, via the hinge element, to the cover of the housing.

14 Claims, 35 Drawing Sheets

(51) Int. Cl.
  *H01L 23/13* (2006.01)
  *H01L 23/055* (2006.01)
  *H01L 23/10* (2006.01)
  *H01L 23/538* (2006.01)
  *H01L 23/00* (2006.01)

(52) U.S. Cl.
  CPC ........ *H01L 23/13* (2013.01); *H01L 23/49838* (2013.01); *H01L 23/5387* (2013.01); *H01L 23/49861* (2013.01); *H01L 24/48* (2013.01); *H01L 24/49* (2013.01); *H01L 2223/6677* (2013.01); *H01L 2224/48091* (2013.01); *H01L 2224/48245* (2013.01); *H01L 2224/49171* (2013.01); *H01L 2224/73265* (2013.01); *H01L 2225/107* (2013.01); *H01L 2225/1023* (2013.01); *H01L 2924/15153* (2013.01); *H01L 2924/15162* (2013.01)

(58) Field of Classification Search
  USPC ........................................................ 257/668
  See application file for complete search history.

(56) References Cited

U.S. PATENT DOCUMENTS

| | | | |
|---|---|---|---|
| 7,358,444 B2 * | 4/2008 | Nickerson | H01L 23/5387 174/254 |
| 7,812,440 B2 * | 10/2010 | Yamazaki | H01L 23/4985 257/701 |
| 2002/0114143 A1 | 8/2002 | Morrison et al. | |
| 2006/0077644 A1 | 4/2006 | Nickerson et al. | |
| 2009/0065921 A1 | 3/2009 | Yamazaki et al. | |

FOREIGN PATENT DOCUMENTS

| | | |
|---|---|---|
| JP | 2751518 B2 | 5/1998 |
| JP | 2002009234 A | 1/2002 |

* cited by examiner

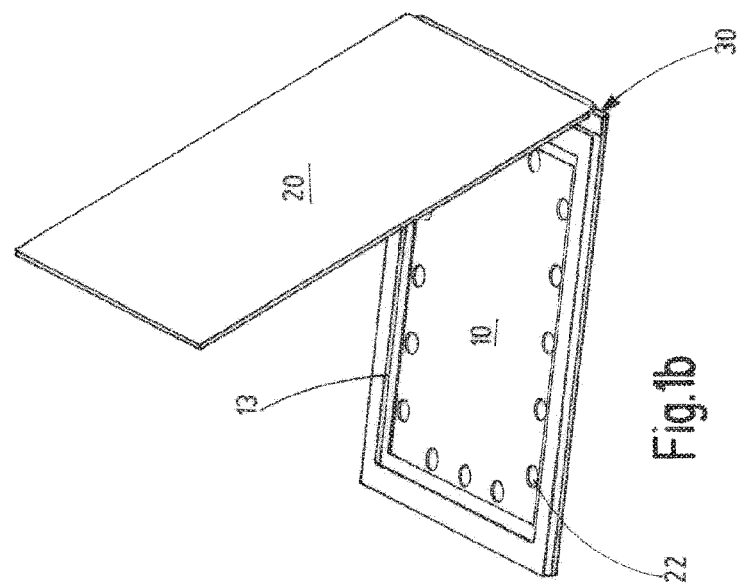
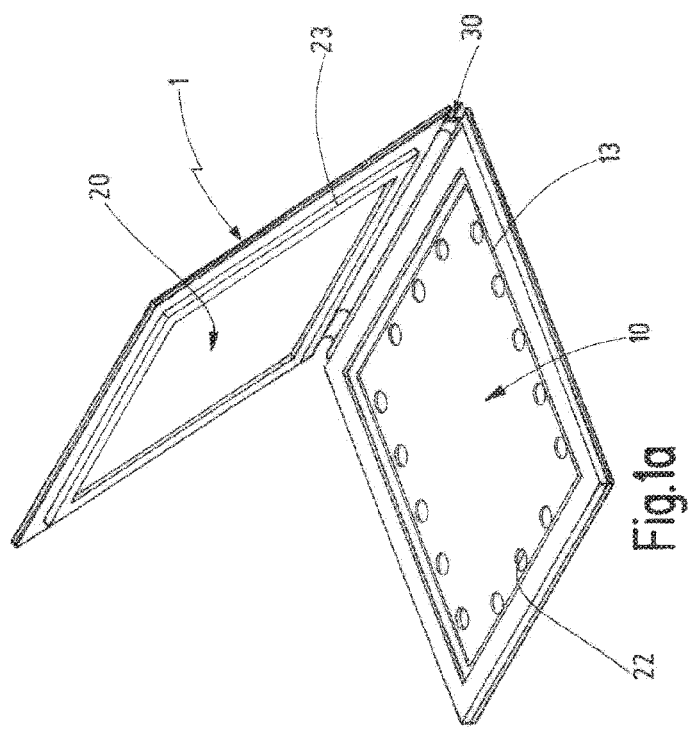

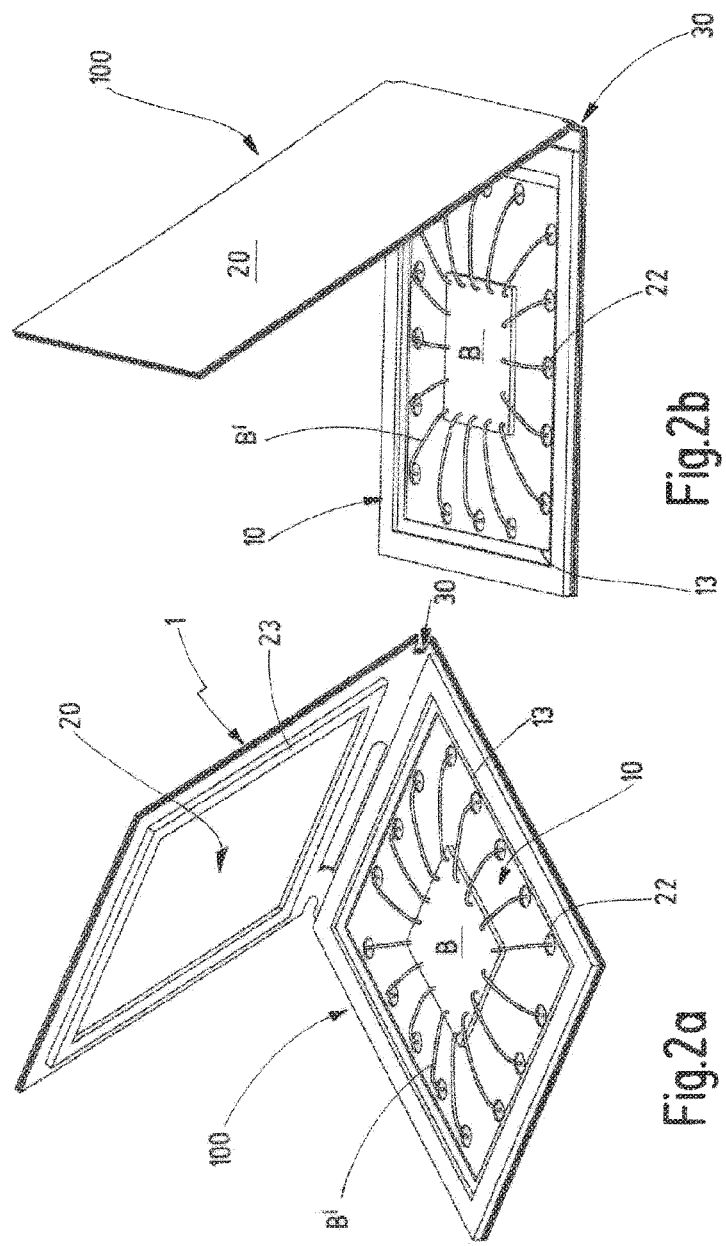

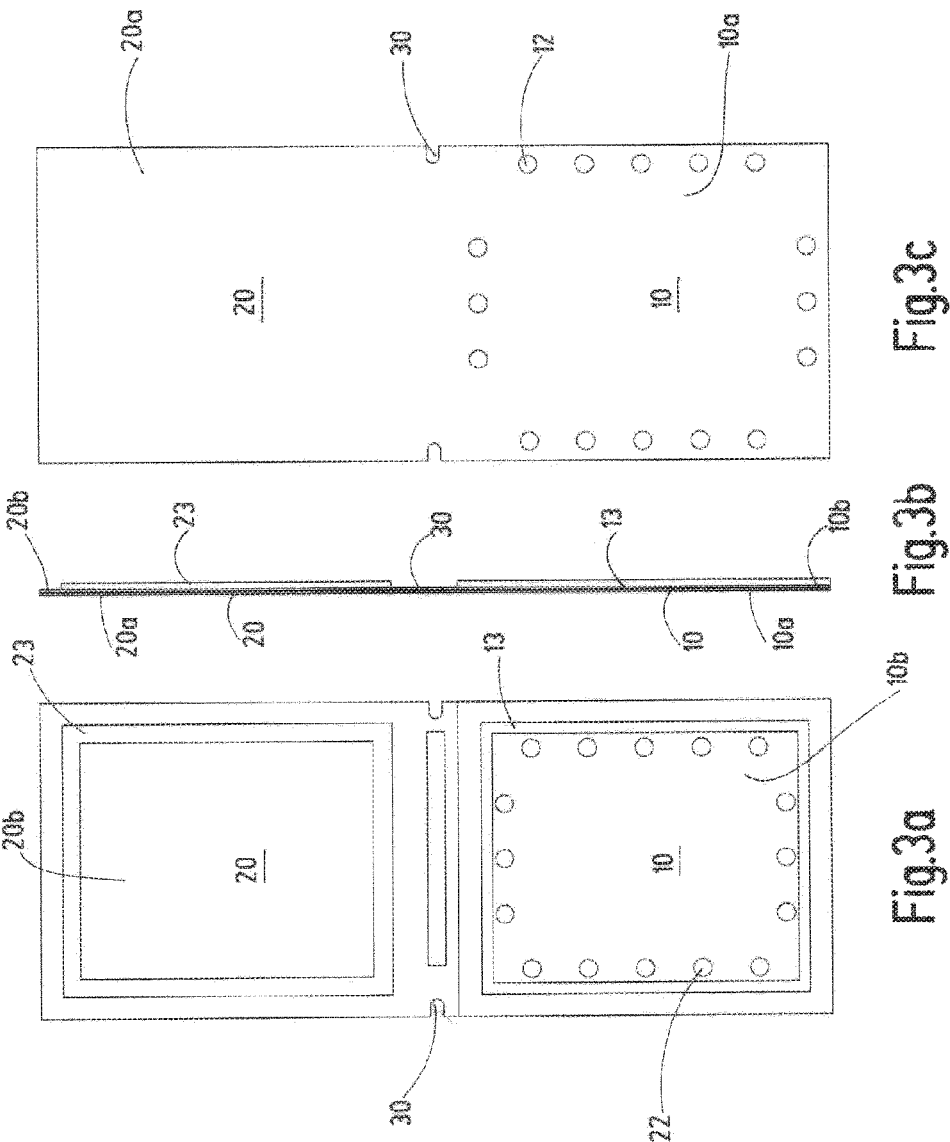

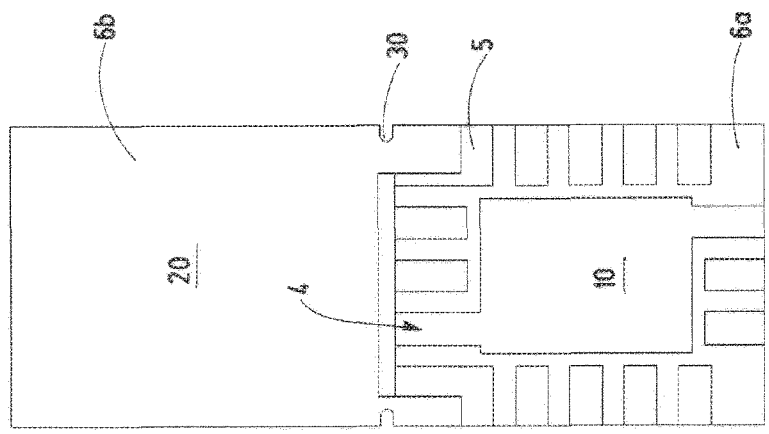
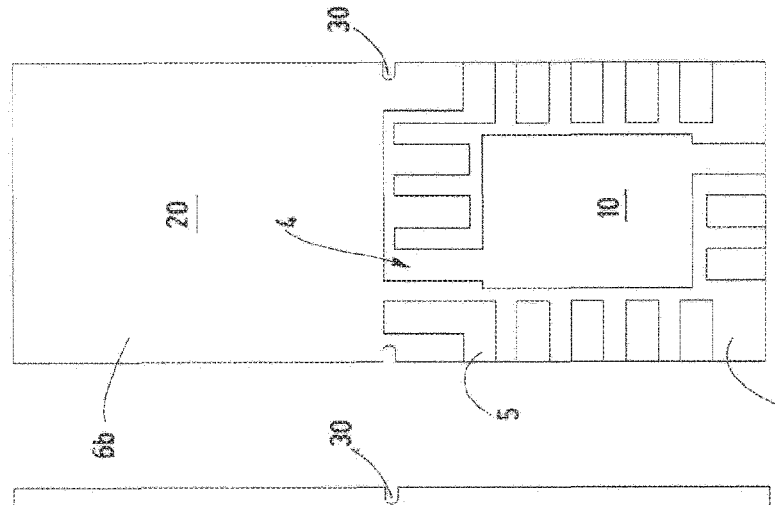
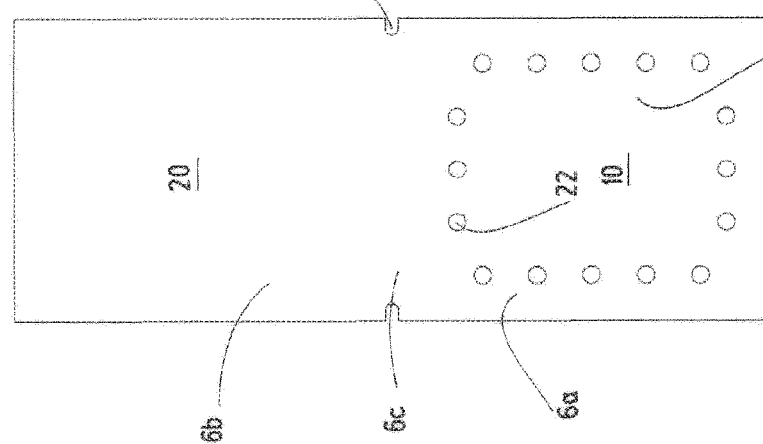

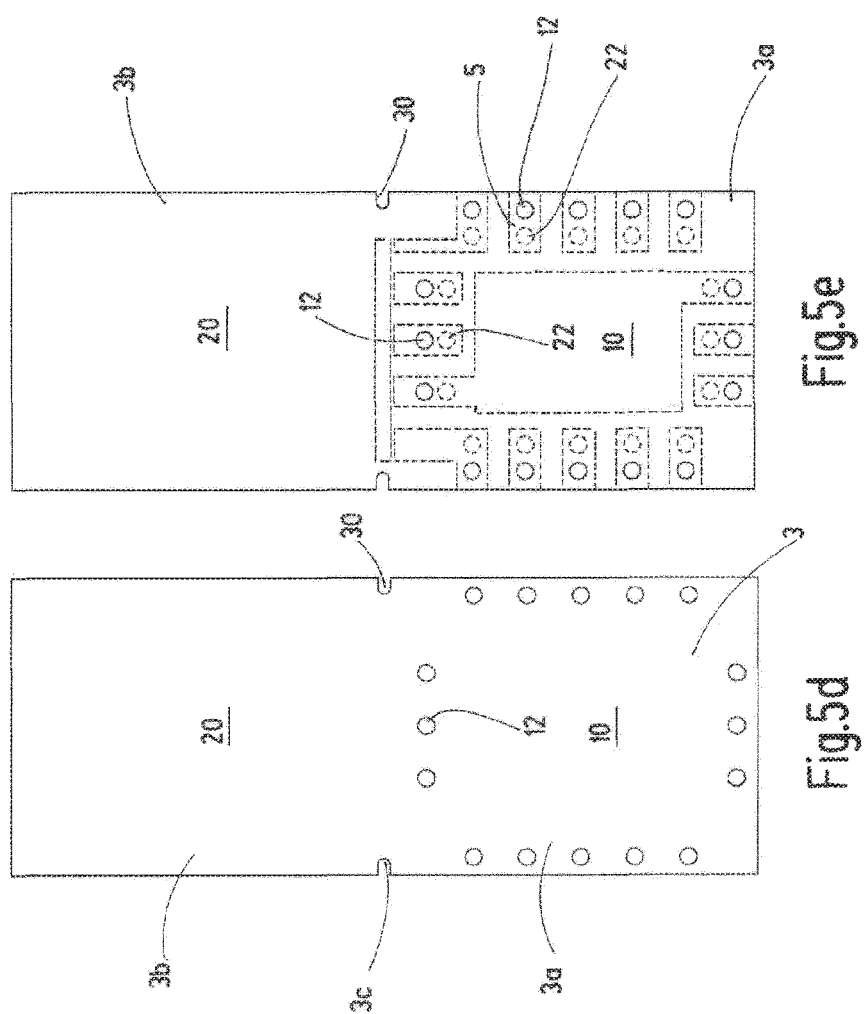

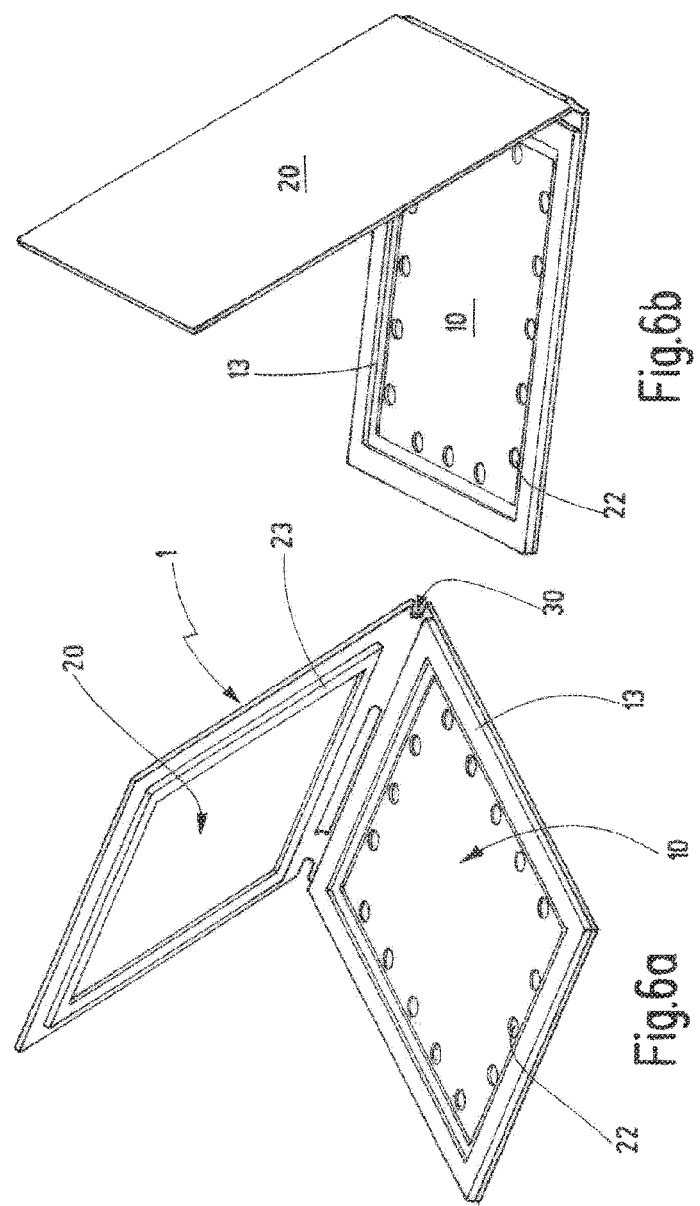

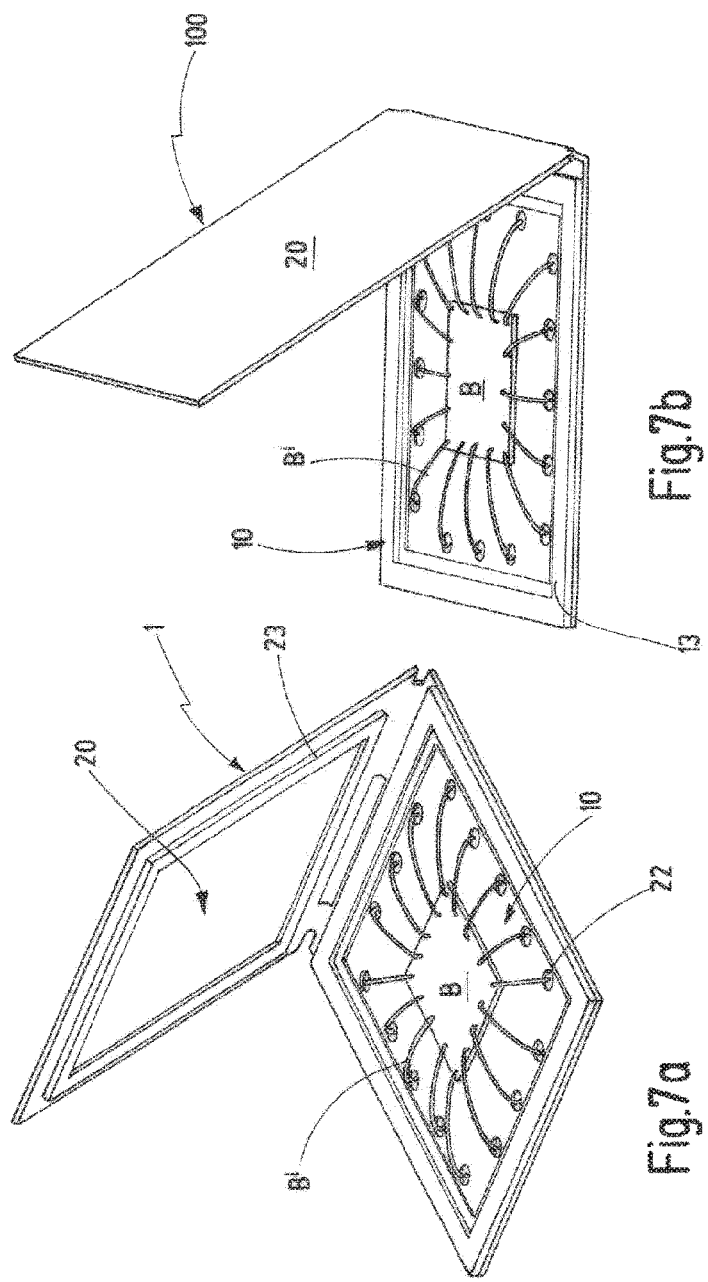

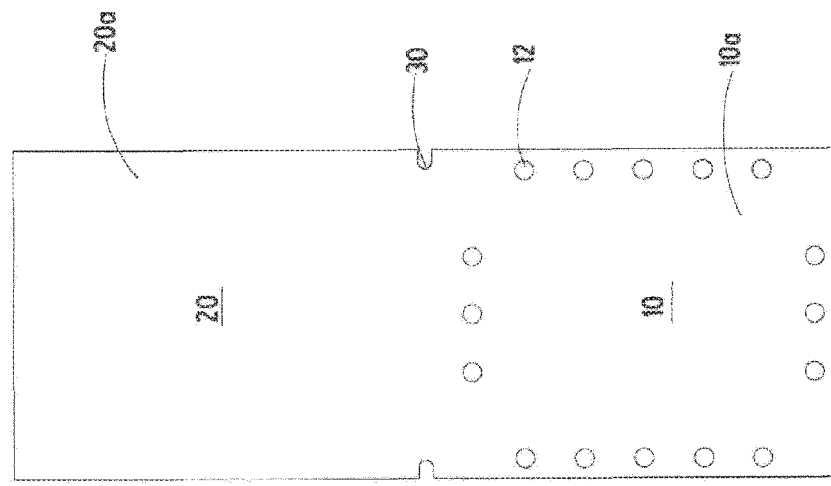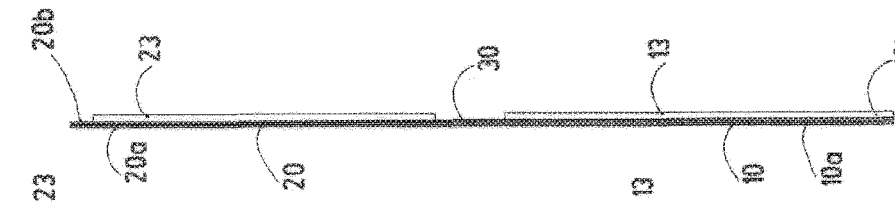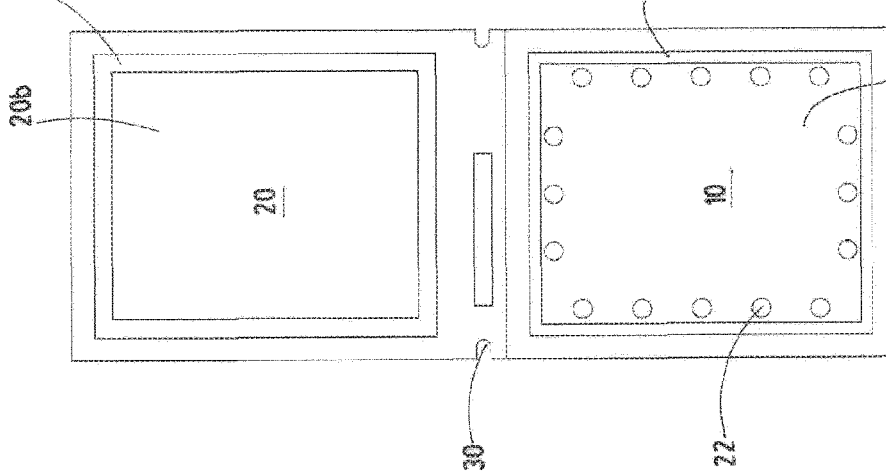

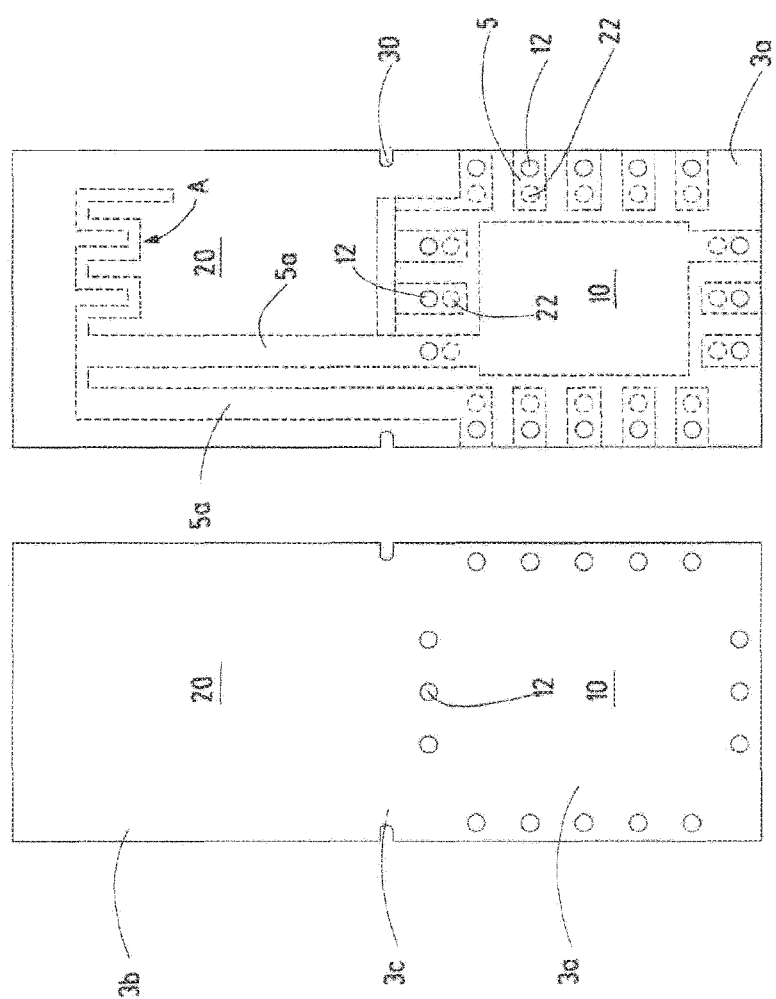

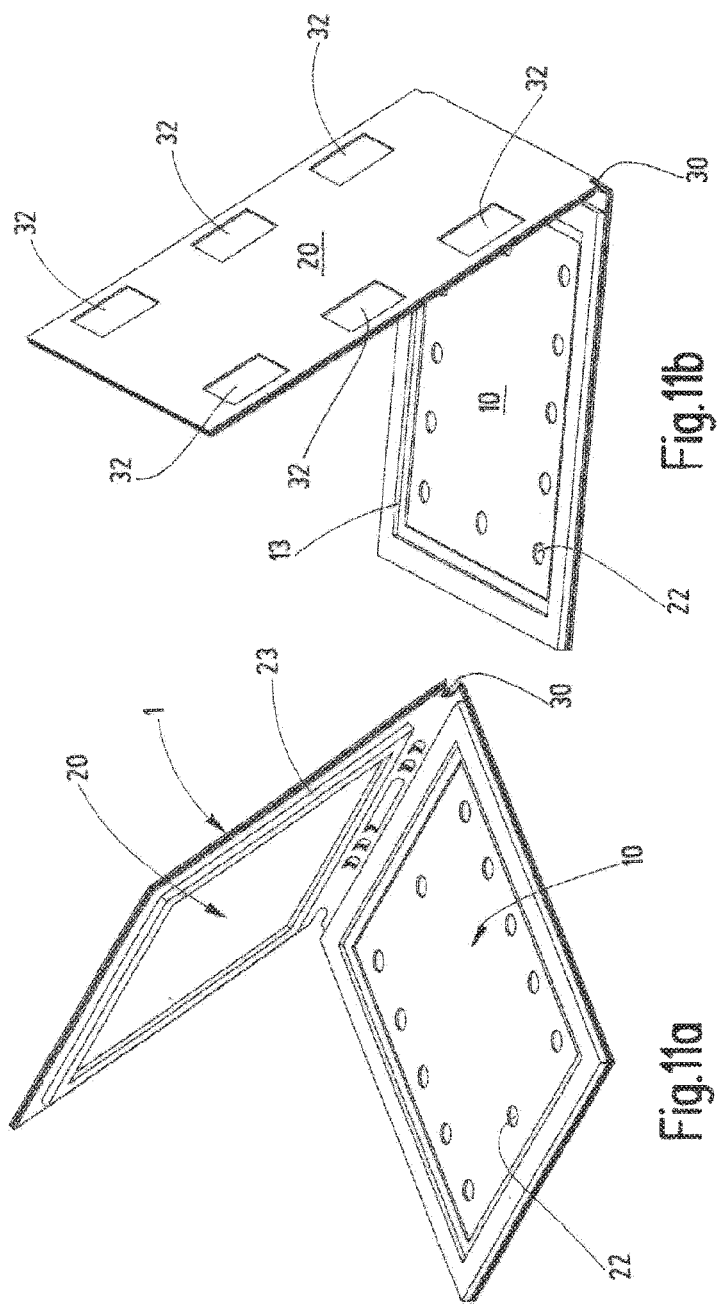

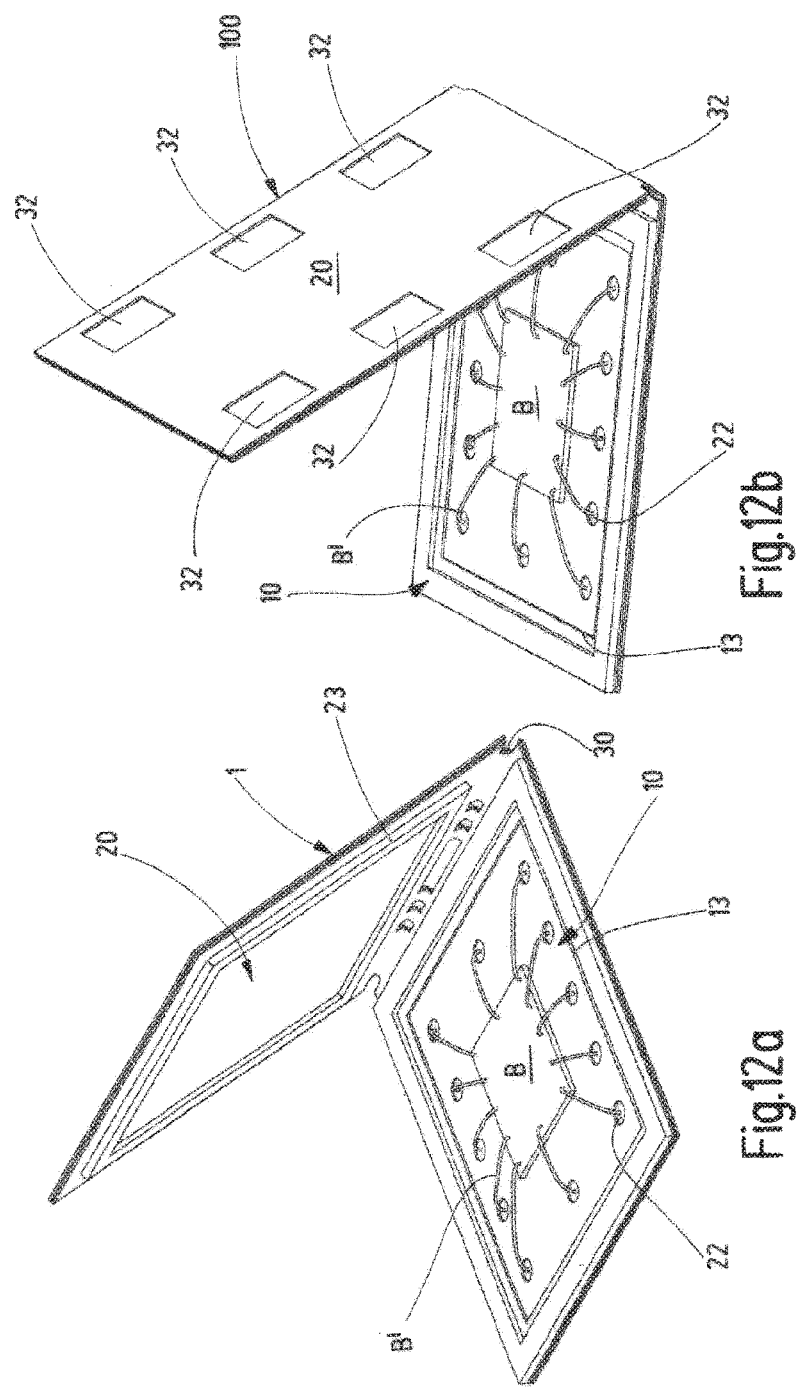

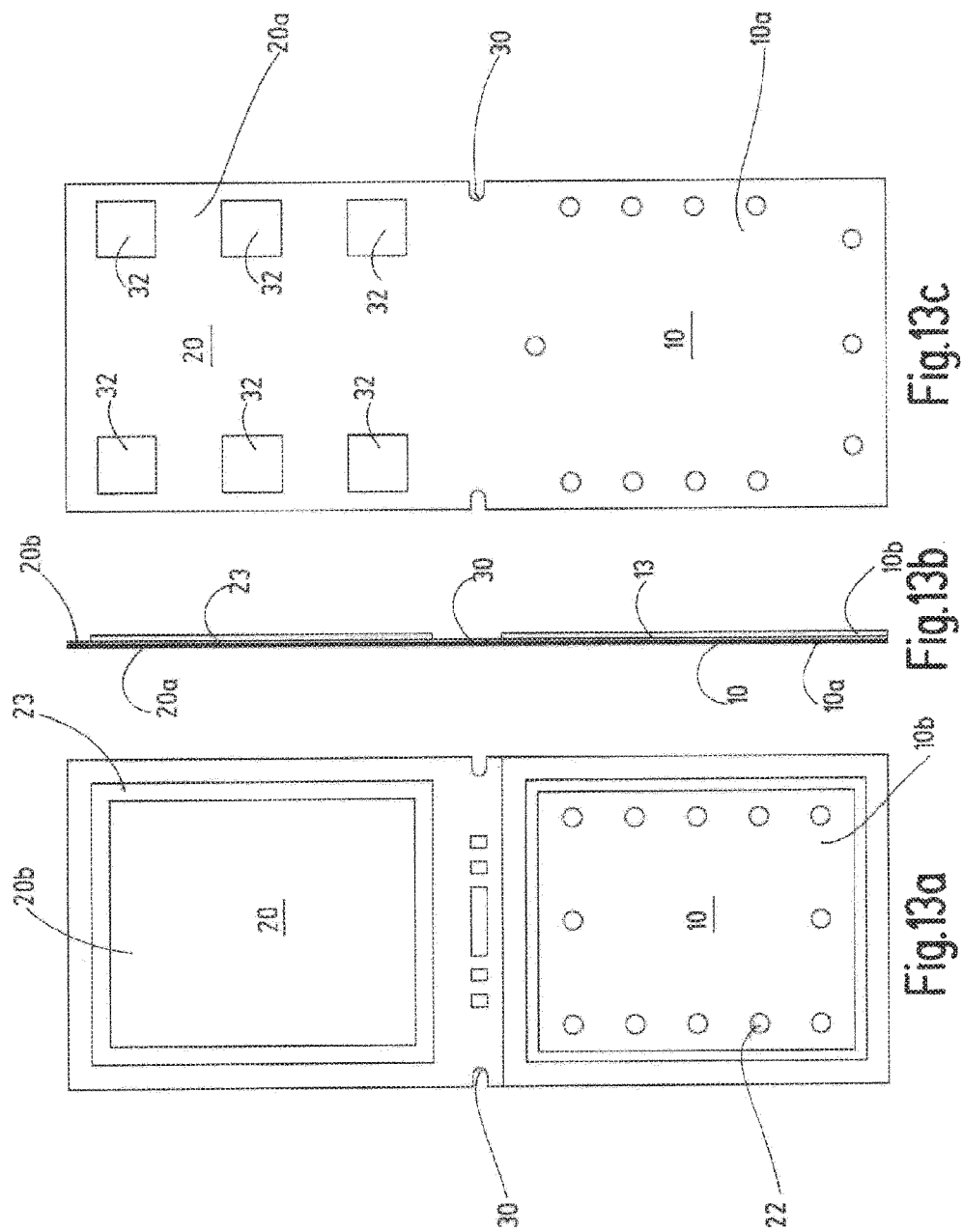

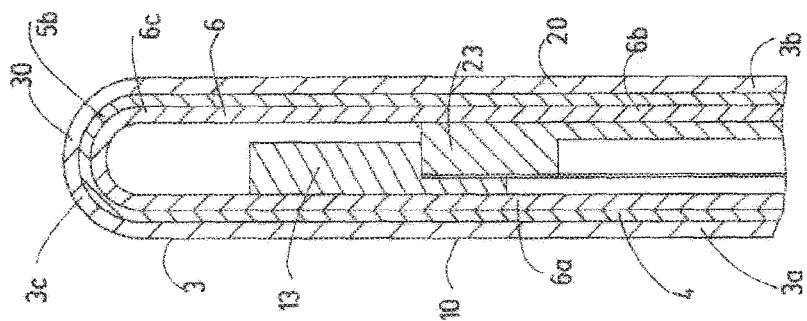
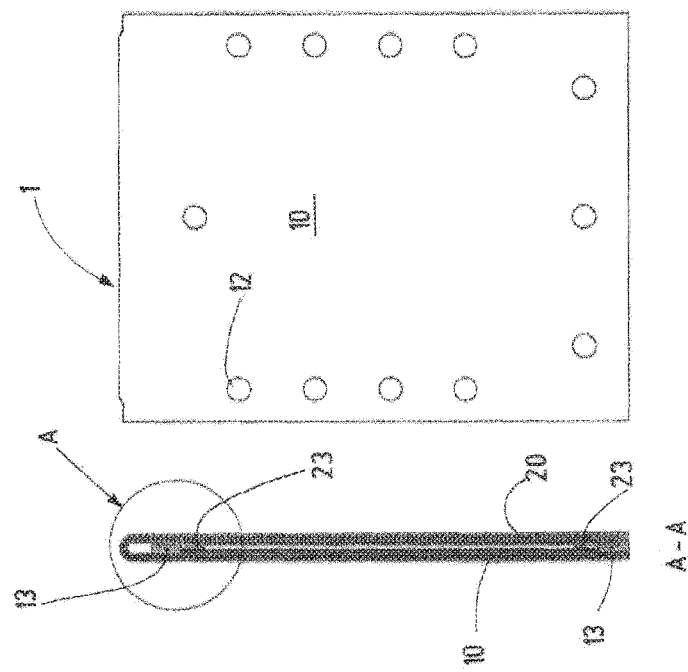
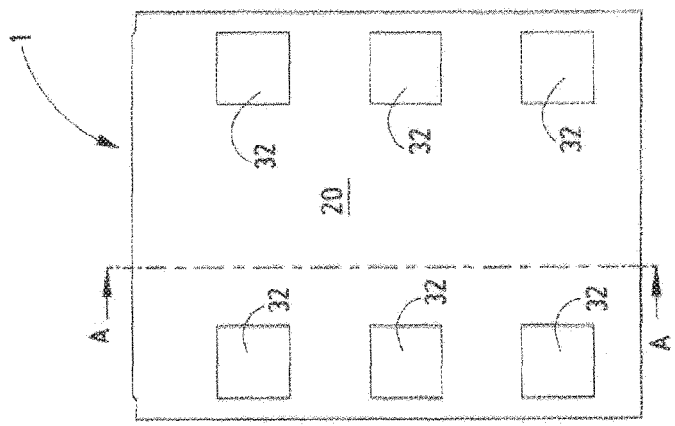

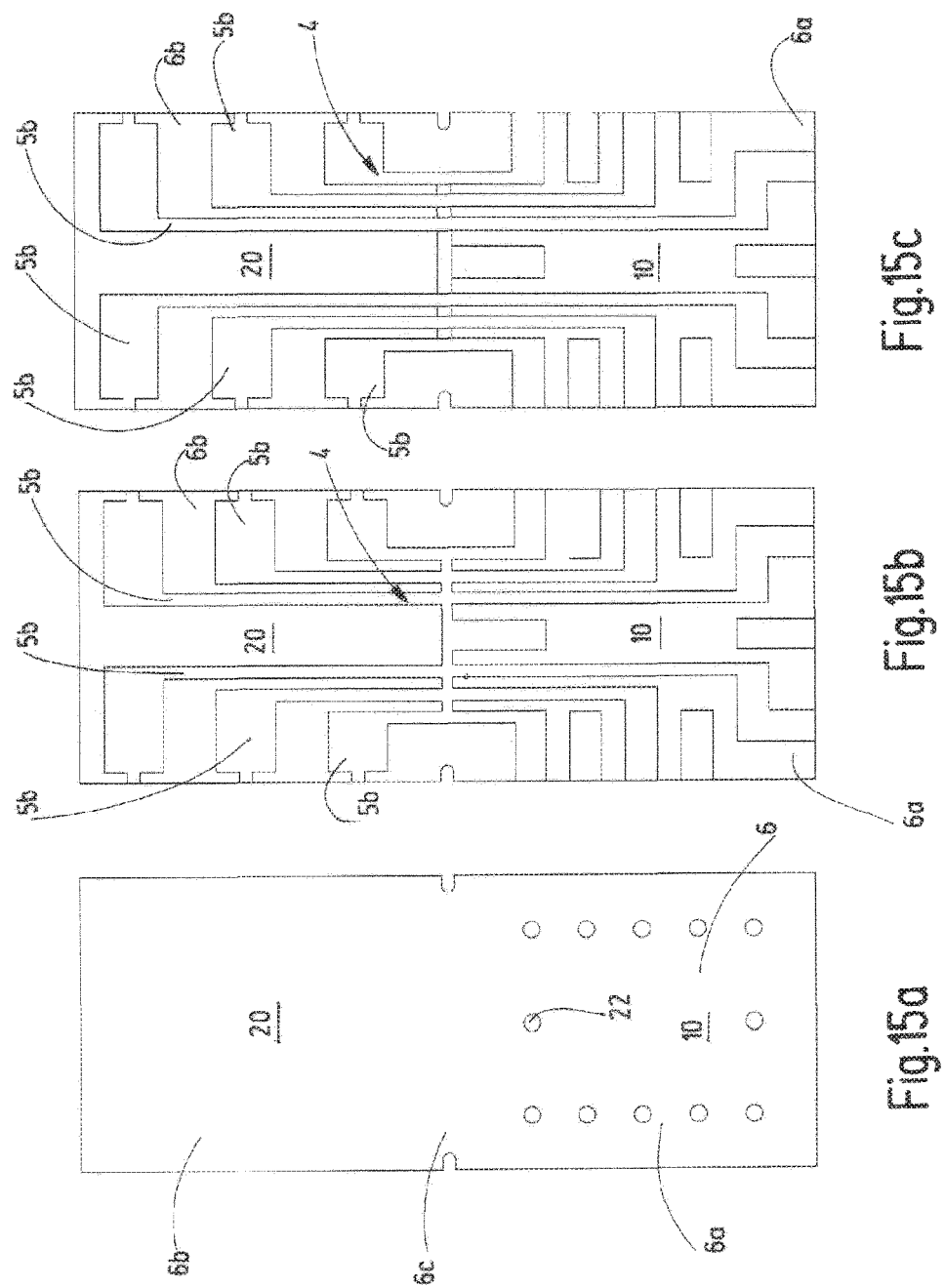

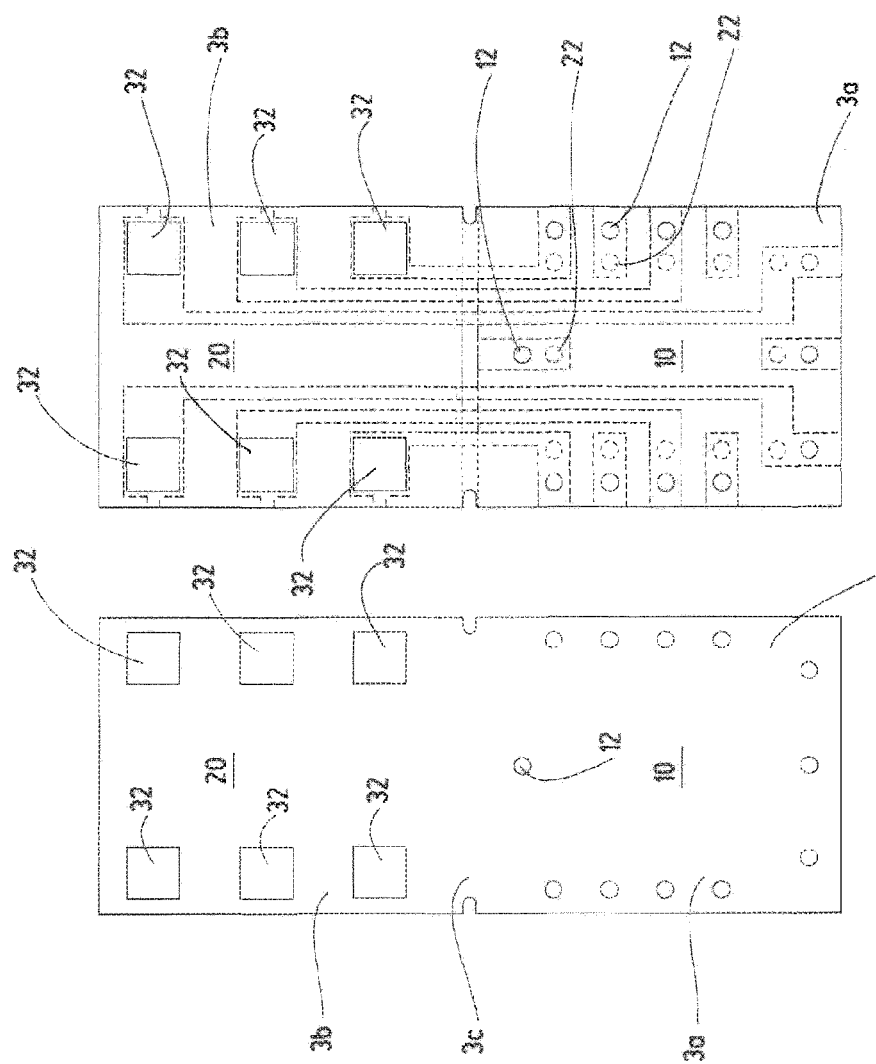

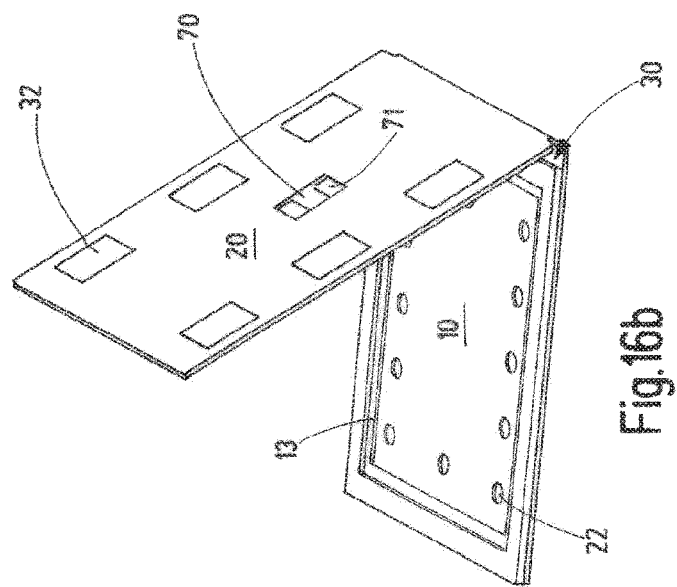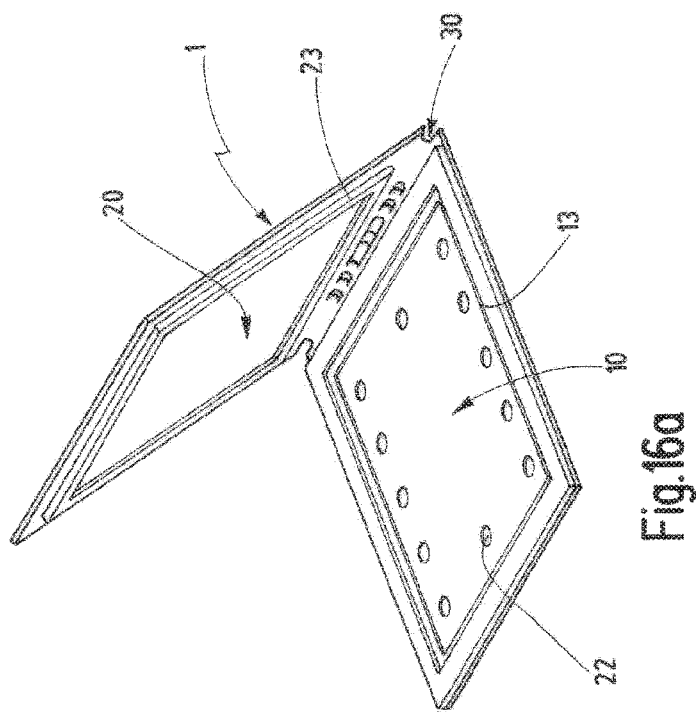

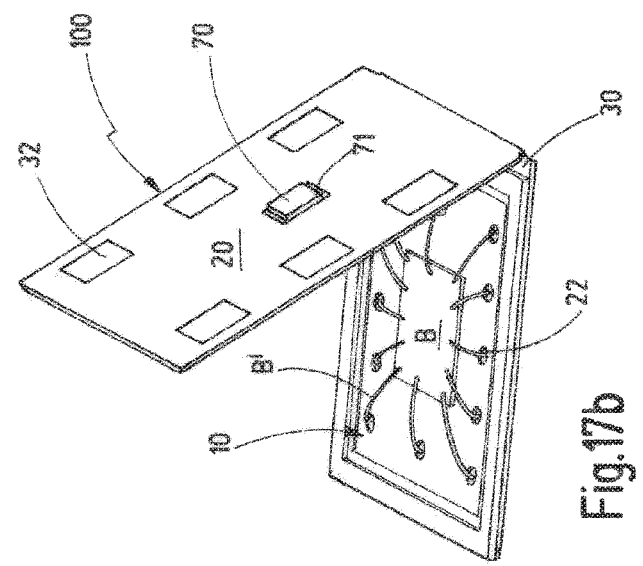
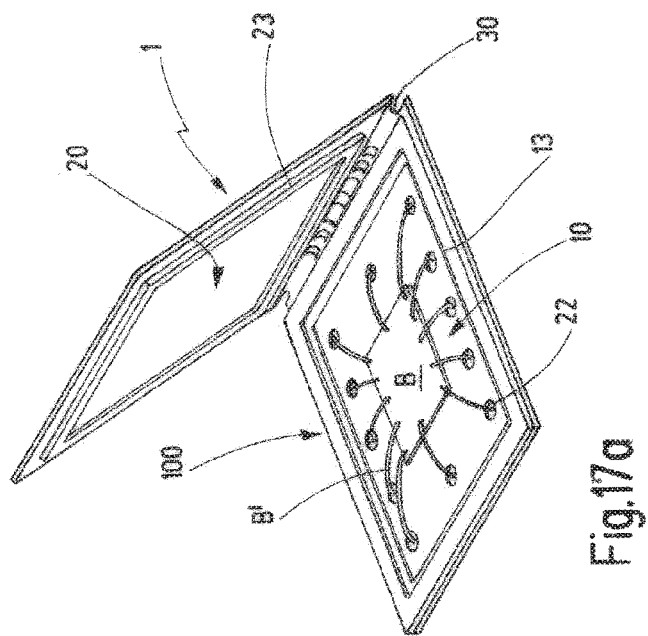

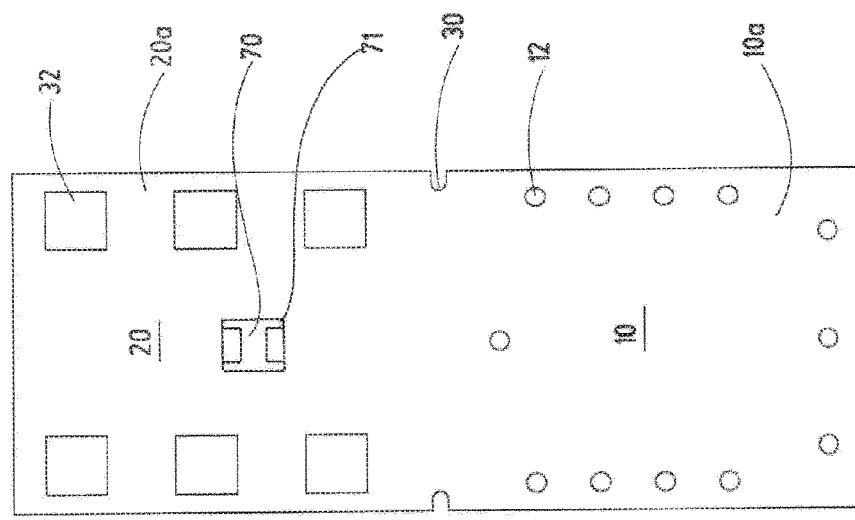
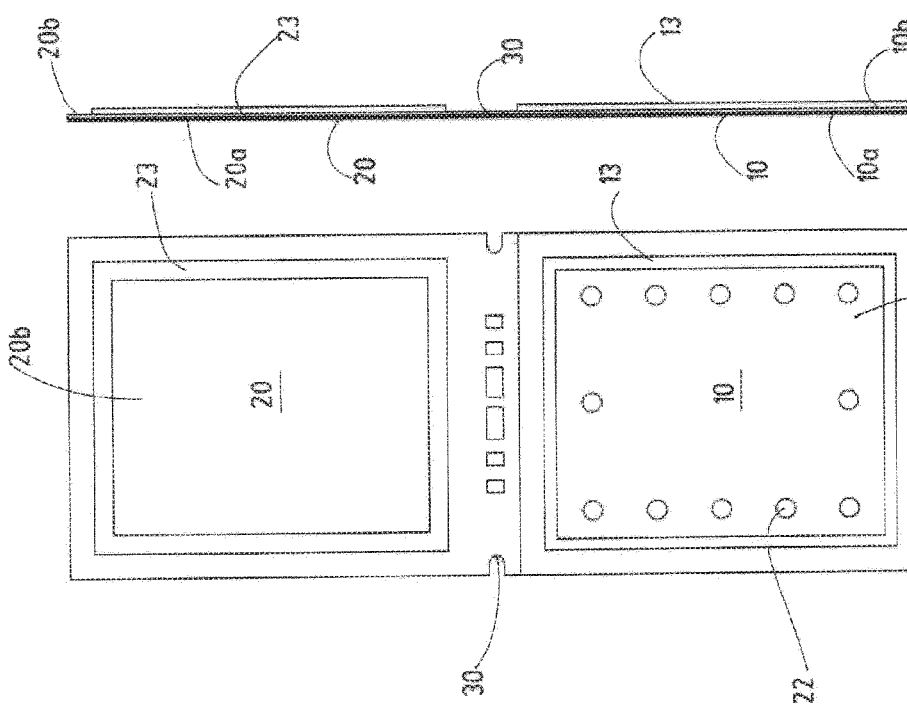

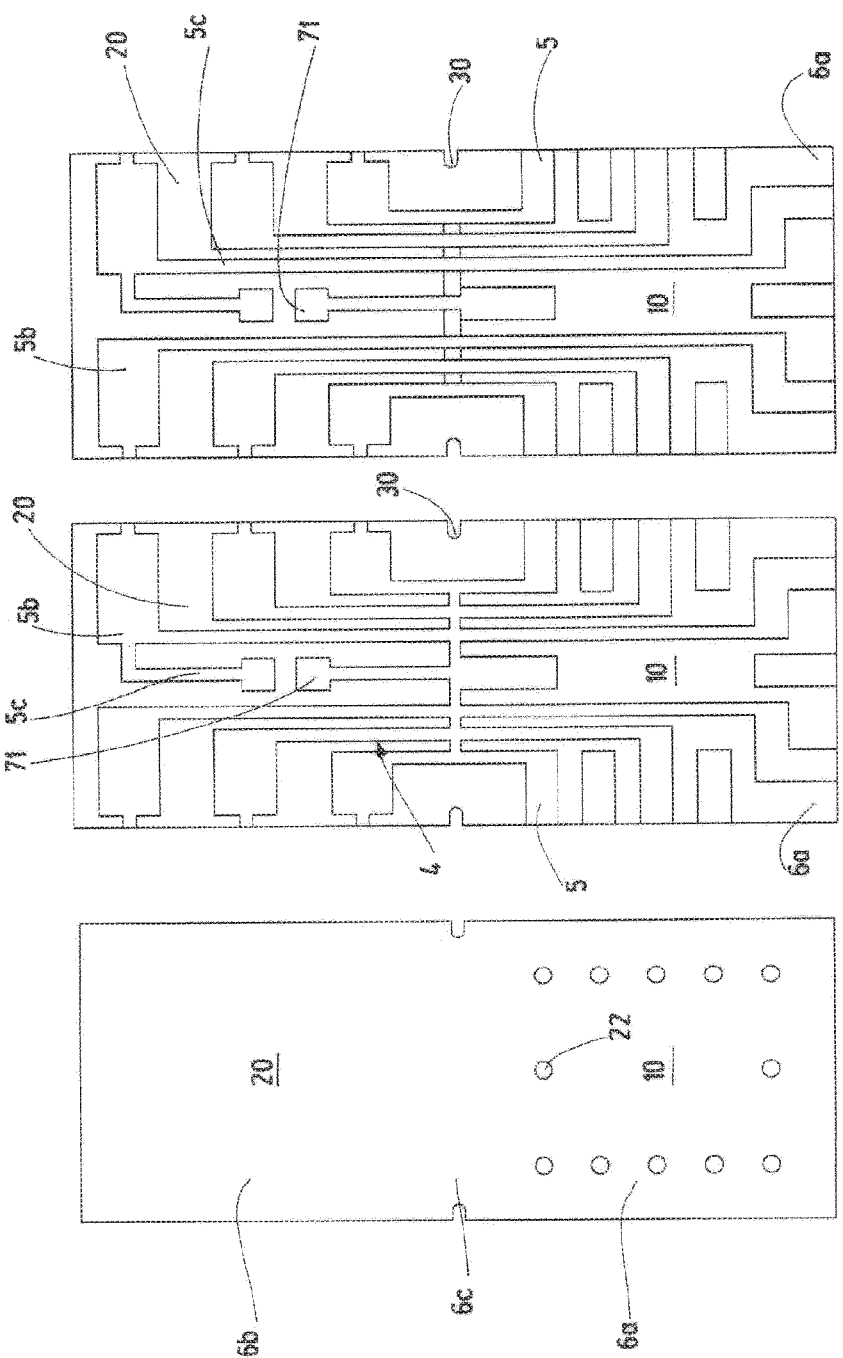

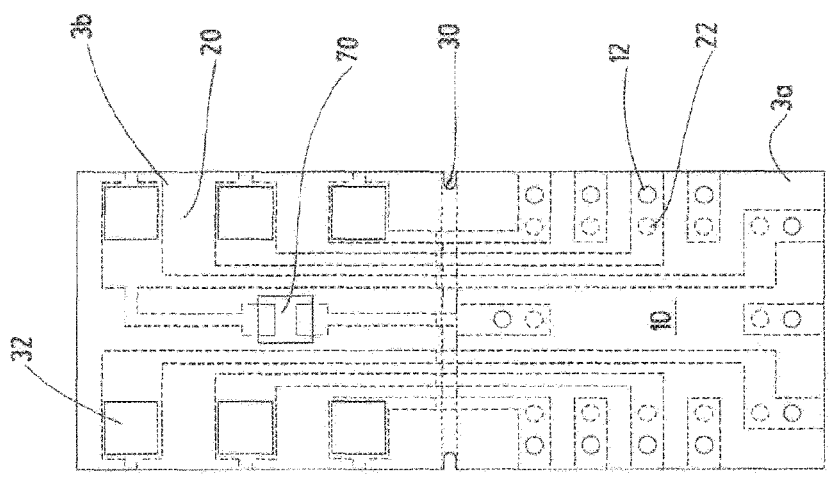
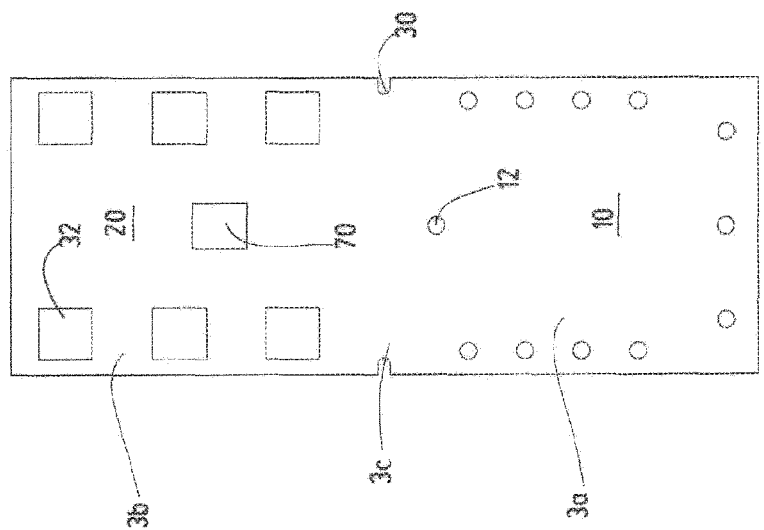

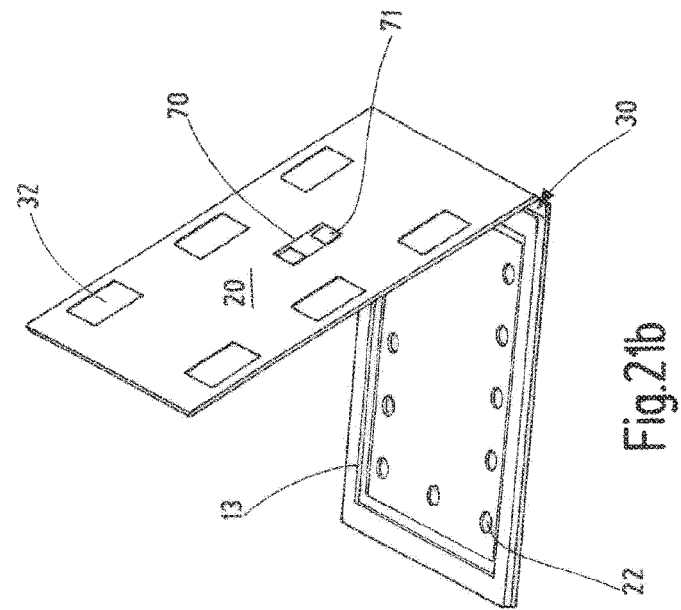
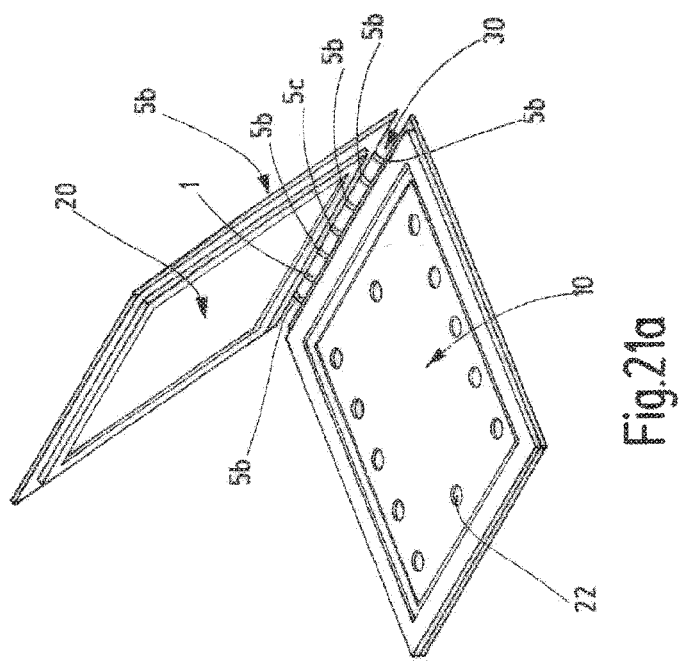

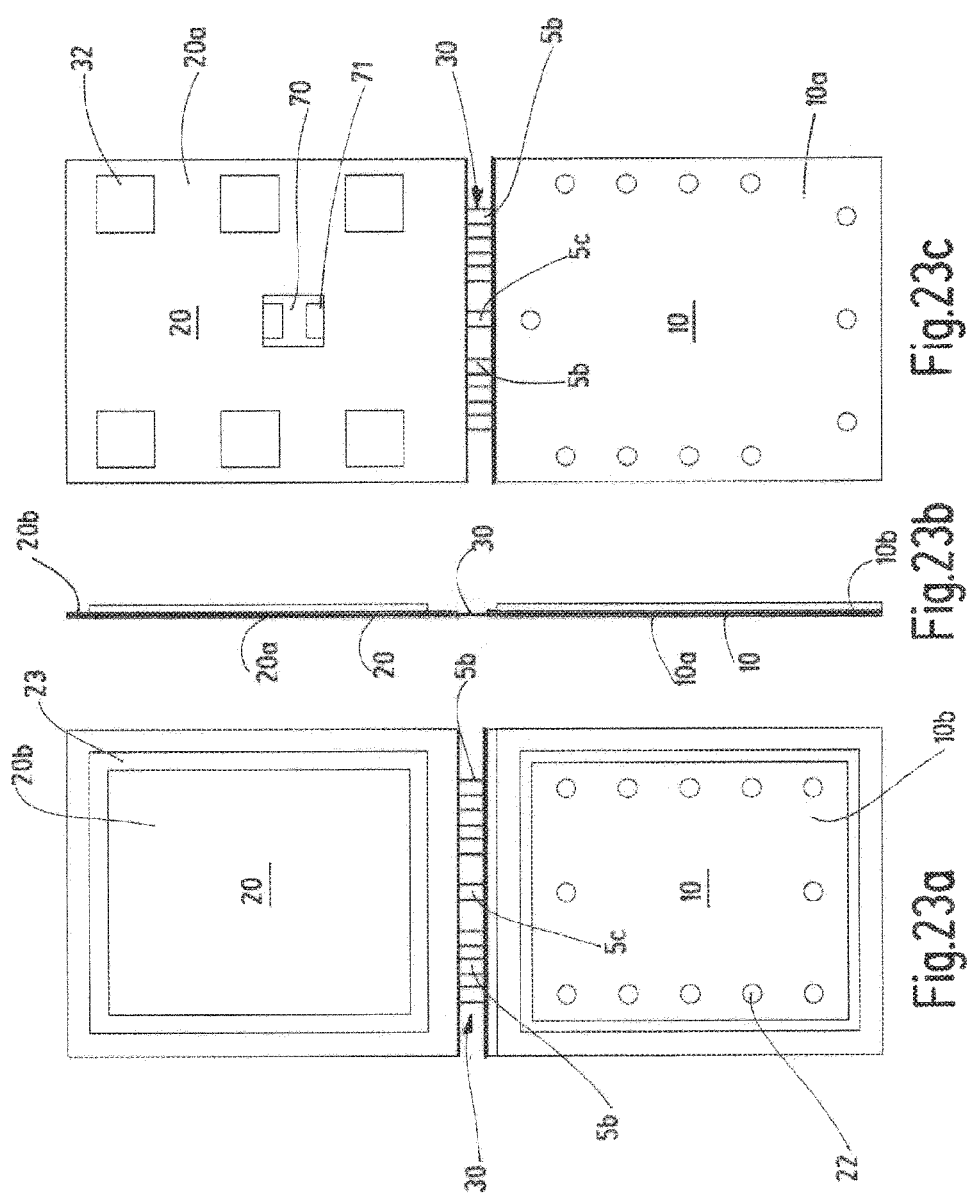

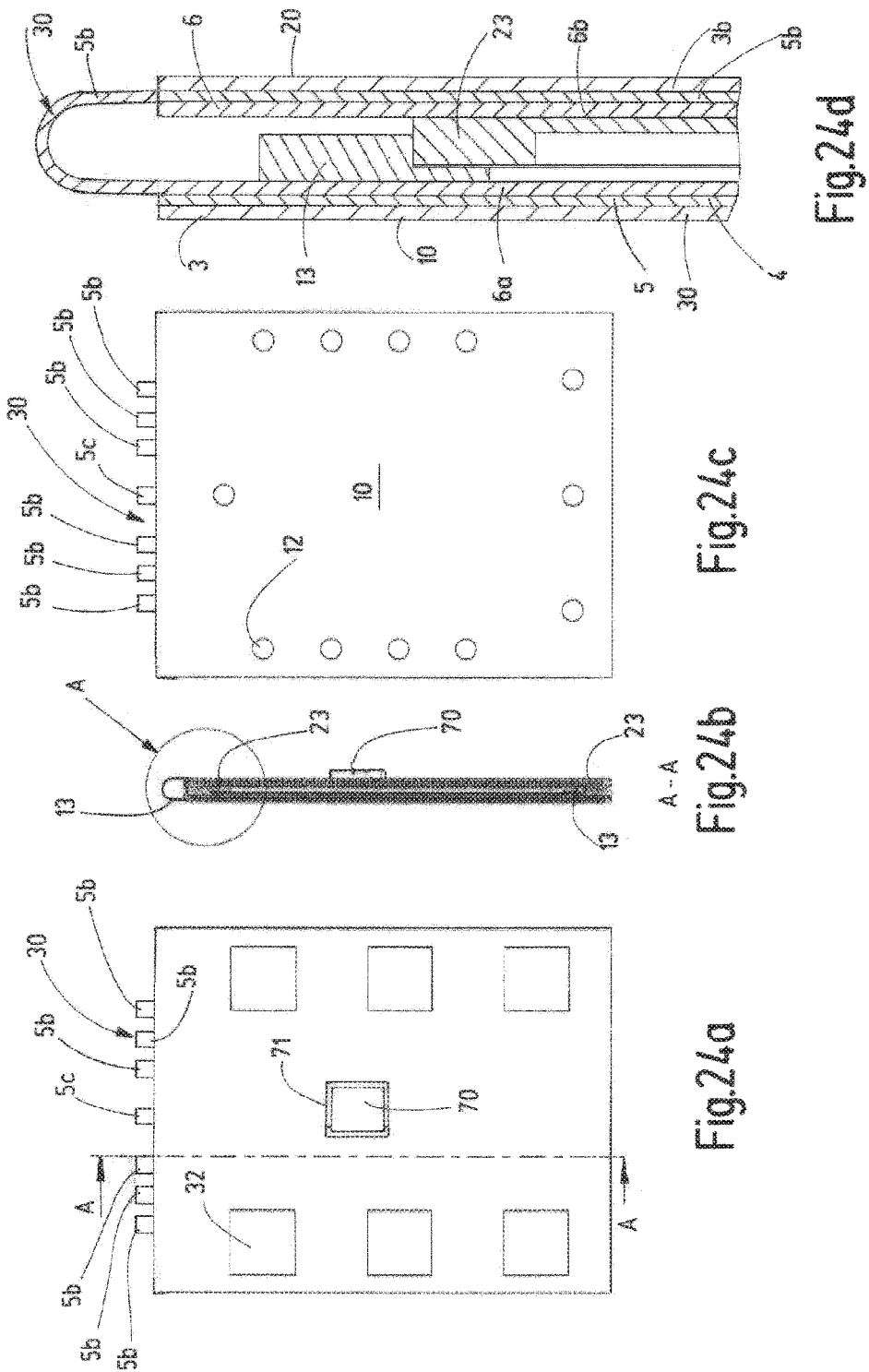

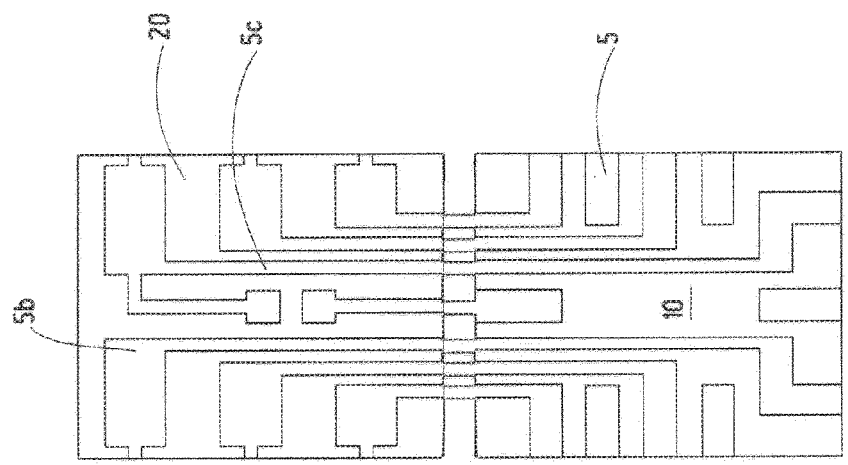
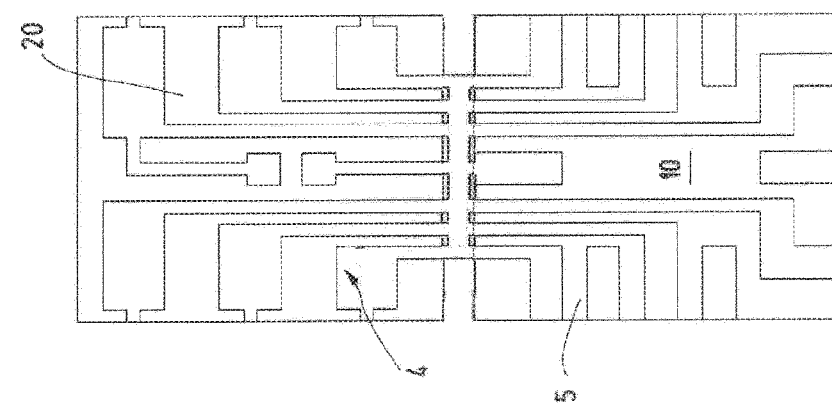
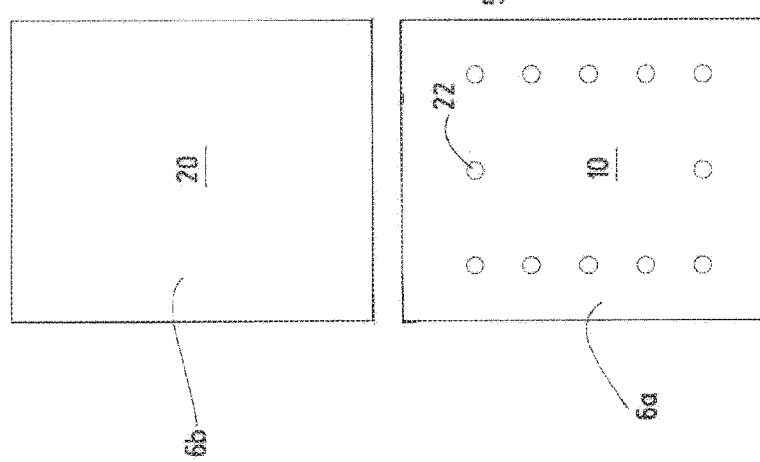
Fig.25c
Fig.25b
Fig.25a

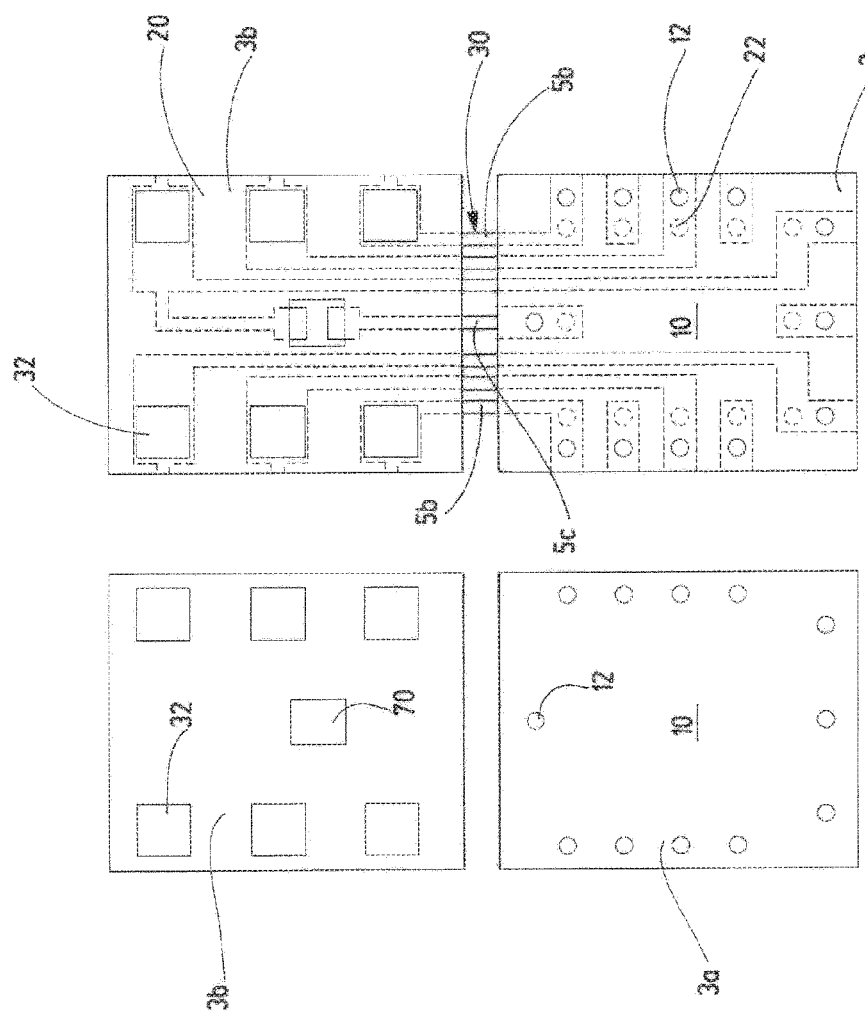

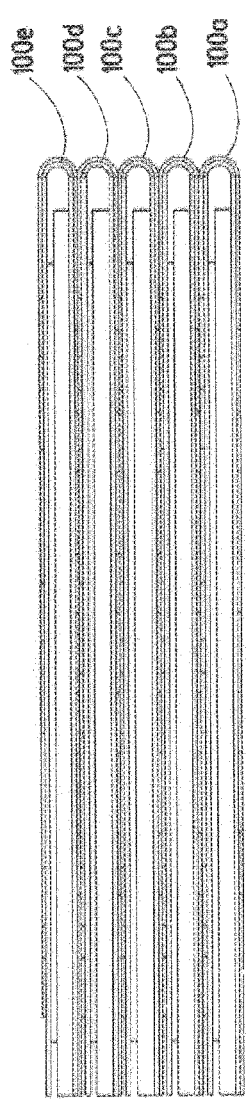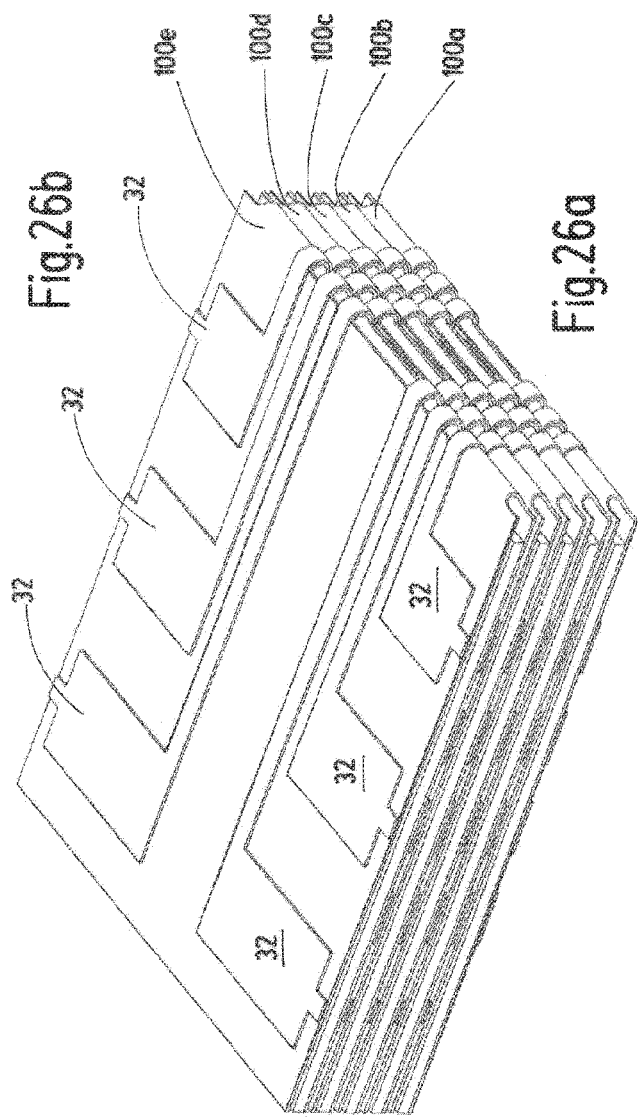

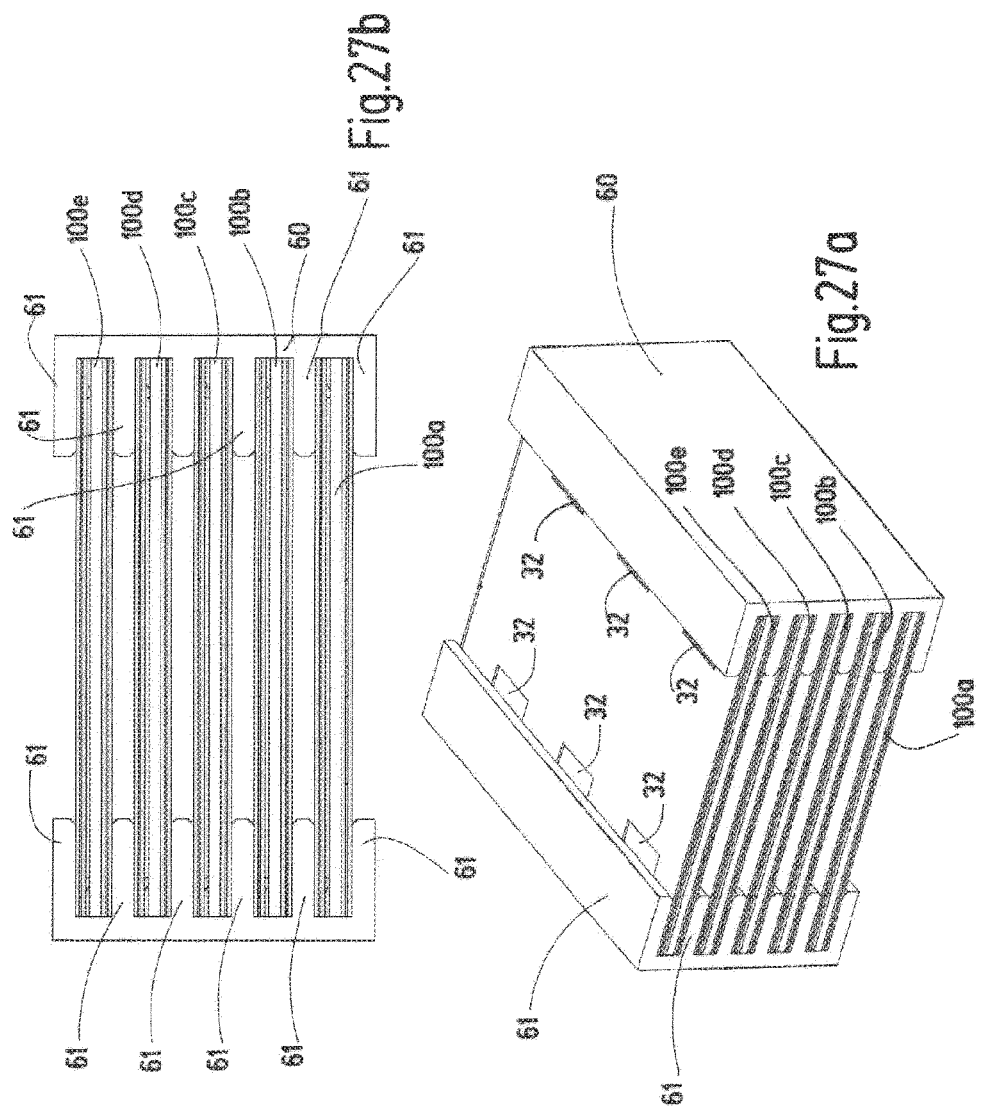

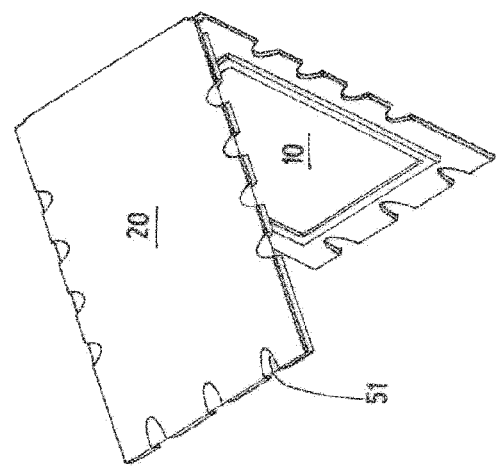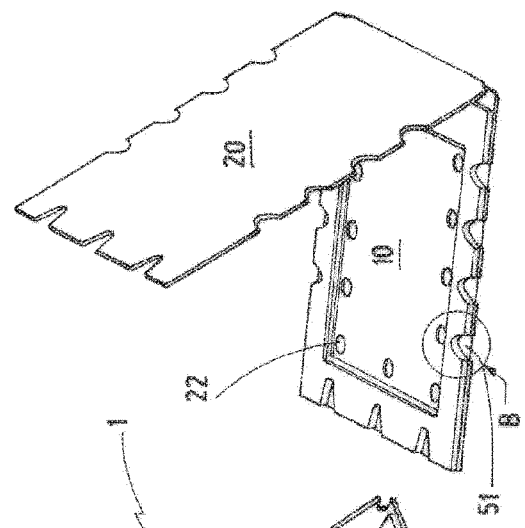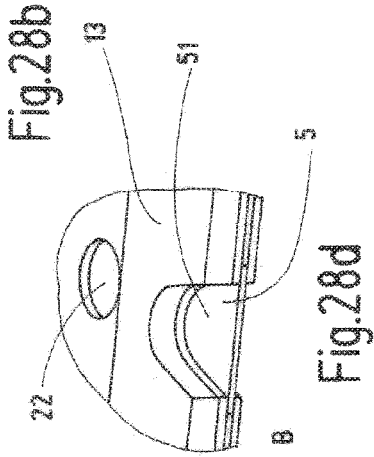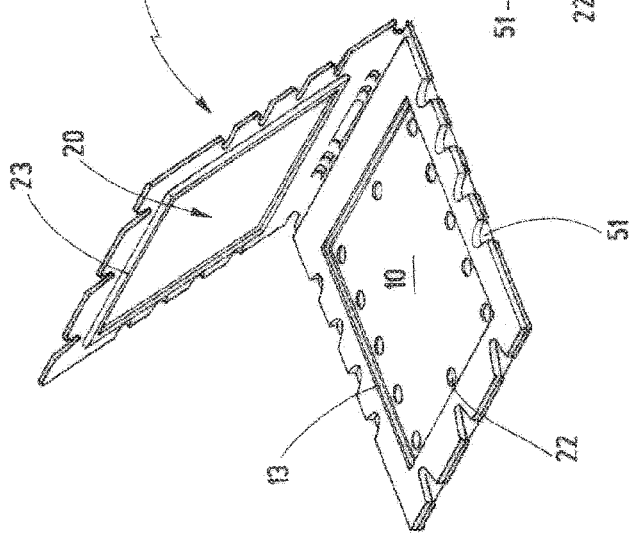

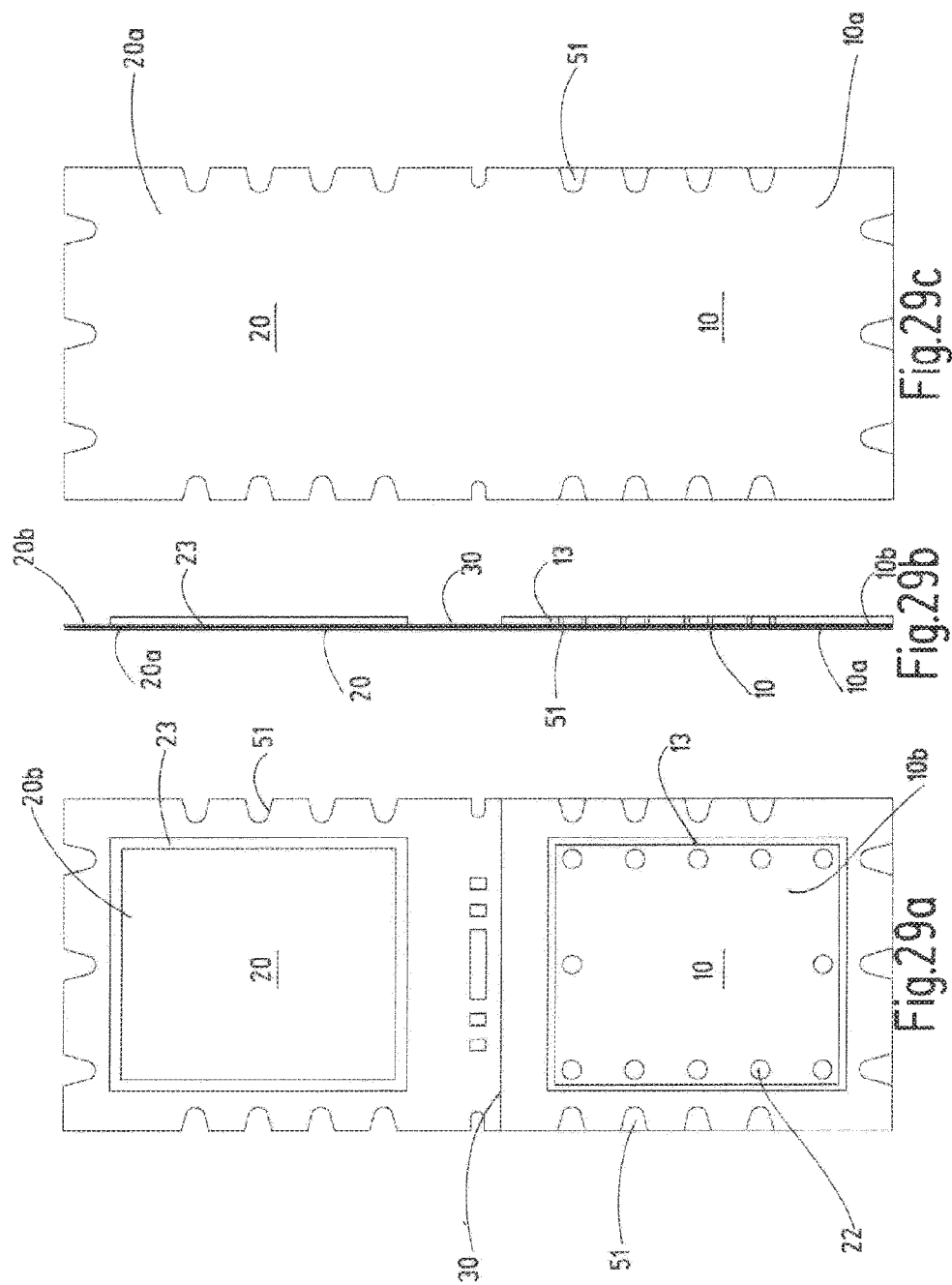

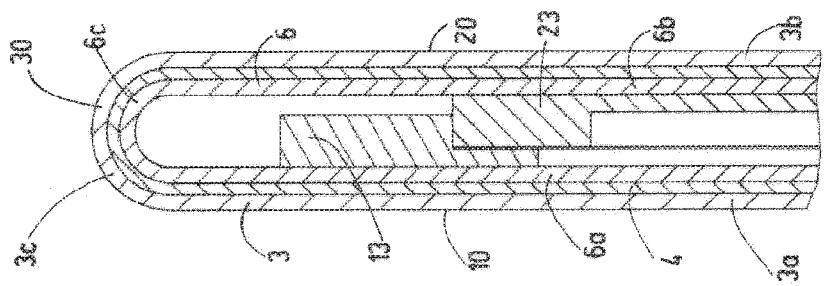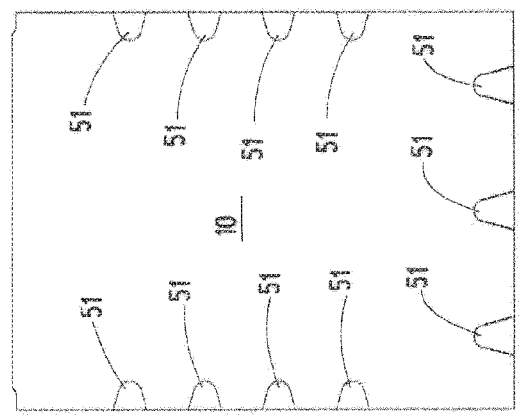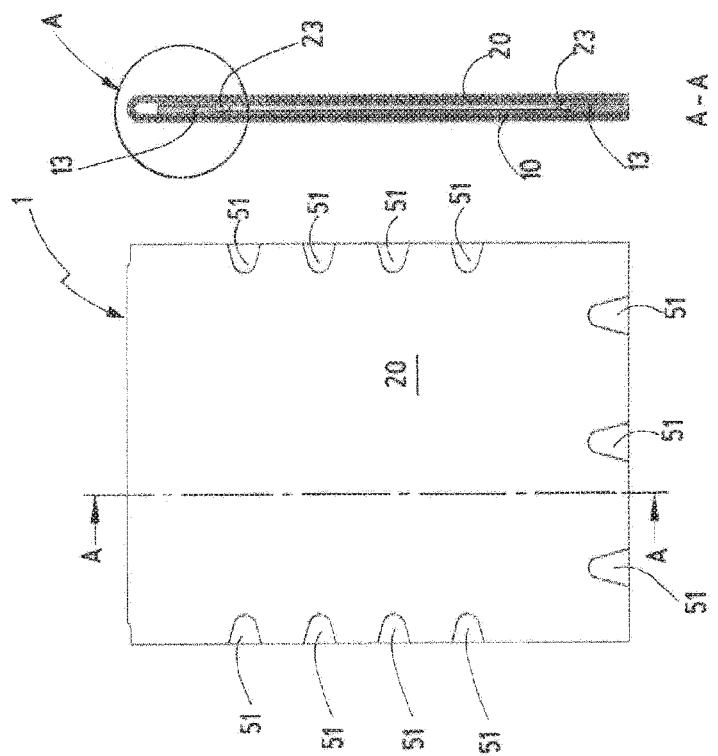

HOUSING FOR AN ELECTRONIC COMPONENT, IN PARTICULAR A SEMICONDUCTOR CHIP

CROSS-REFERENCE TO RELATED APPLICATIONS

This continuation application claims priority to PCT/EP2017/025302 filed on Oct. 6, 2017 which has published as WO 2018/065121 A1 and also the German application numbers 10 2016 011 934.9 filed on Oct. 6, 2016 and 20 2016 006 195.0 filed on Oct. 6, 2016, the entire contents of which all applications are fully incorporated herein with these references.

DESCRIPTION

Field of the Invention

The invention relates to a housing for receiving an electronic component of an electronic module, wherein the housing has a bottom and a cover, whereby the bottom and the cover are connected via a hinge member and the bottom and the cover of the housing can be folded on each other via the hinge member, whereby in the housing at least one lead frame comprising conductor paths is arranged, wherein at least one conductor path of the lead frame is provided in the bottom part of the housing and at least one further conductor path is provided in the cover part of the housing, and wherein said at least one further conductor path extends from the bottom part of the housing via the hinge member to the cover part of the housing to such an electronic module as well as to a method for manufacturing a housing for an electronic module.

Background of the Invention

Such electronic modules are often manufactured by a so-called nakedchip-mounting, this means that unhoused electronic components, in particular unhoused semiconductor chips, are directly mounted on a carrier, in particular on a rigid circuit board or a flexible carrier film. The main advantage of such a method are the low manufacturing costs, which are particularly advantageous in a mass production of electronic modules. This naked-chip-mounting, often referred to as chip-on-board techniques (COB), furthermore has got the advantage that unhoused electronic modules require a smaller space in comparison to ones already being housed prior to mounting, so that a higher component density on the carrier of the electronic module can be achieved. In particular, when such manufactured electronic modules are used in a harsh environment, it is necessary to encapsulate the unhoused electronic components. Known approaches therefore are encapsuling the naked chips, in particular via thermosetting plastics, providing a protective cap or applying a protective layer covering the entire electronic module.

The aforementioned approaches have the disadvantage that such an encapsulation of the electronic component or the electronic component mounted on a carrier of the electronic module makes it difficult, if not impossible, to replace defective electronic components and hence repair the electronic module. Furthermore, it is also difficult or even not possible to perform application-specific modifications of the electronic module subsequently.

A further disadvantage of such an encapsulation is that it only serves to shield the component of an electronic module contained therein against environmental influences. The known housings do not have a further functionality. This is in particular disadvantageous in relation to the component density: As outlined before, such encapsulated electronic components are mounted on a carrier on which only a limited space is available. Since—as stated above—an encapsulated electronic component requires more space than a naked chip, the component density on the carrier of the electronic module is reduced when using a housing designed as described before. Therefore, there is a need to increase the component density even in the case of electronic components accommodated in a housing, this is to make better use of the space occupied by the housing on the carrier of the electronic module.

US 2002/114143 A1 discloses an assembly of electronical components, which is formed in such a way that a flexible rectangular strip-like structure, preferably a polymer film, is folded. The structure described in the aforementioned document is a so-called "flip-chip-on-film-assembly", i.e. an assembly with which a capsuled electronic chip is arranged on a thin film and is connected via conductor paths arranged on said film. This thin film allows that a first portion of the thin film, which contains a first capsuled component, and a second portion, which contains a further capsuled component, is fold around a flexible area of the structure, so that the aforementioned vertical configuration can be achieved. The structure of the aforementioned document is not a housing, but a meander-like foldable strip, by which its capsuled electronic components can be arranged one above the other and electronically connected.

U.S. Pat. No. 6,300,679 B1 describes a similar structure. In this case too a substrate is used, which is part of a band. This structure contains a middle area, which connects opposite end areas so that the substrate can be folded around the semi-conductor chip by folding the substrate along a line in such a way that the first end area of the substrate lies above a second end area. In the substrate a layer of a conductor paths is arranged, whereby the conductor paths extend on the middle area and end in the end areas.

DE 692 09 772 T2 describes an arrangement for forming a housing around a functional unit, e. g. around a semiconductor element, around an element based on a semiconductor, a sensor element, a micro actuation member or an electronic circuit consisting of one or several integrated circuits and other electronic components, wherein the housing comprising two housing parts, which form at least one closed cavity, which surrounds the aforementioned functional unit entirely or at least in part. Metal parts are provided, which run through the walls of the housing and form wire connections to the functional unit being surrounded by the housing. The cavity is sealed and filled with an electrically insulating fluid. It is provided that the housing is made of a thermoplastic molding compound and that at least parts of the walls surrounding the cavity are made yielding in order to absorb expansion forces of the electrically insulating fluid. According to an exemplary embodiment of this housing it is provided that the housing is formed of a base component and a cover component, which are connected to one another by a hinge. The wire connection for contacting the functional device accommodated in the housing is provided in the base component. The two aforementioned components are fastened to one another by means of an adhesive or by welding and the electrically insulating fluid is introduced in the form of a liquid or a gel substance via filling holes into the cavity of the housing formed thereby.

U.S. Pat. No. 5,041,696 A describes a housing for an electronic component, which has a cup-shaped base part and a cover part, wherein these two parts are connected to each other via a hinge element. To close the housing, the cover part is folded onto the base part and is sealingly connected with that.

US 2006/077644 A1 describes an electronic device which comprises a first electronic component and a second electronic component, which are mechanically and electrically connected by a foldable substrate and an interposer of the first electronic component. For the manufacturing of the device, the first electronic component is put on a bottom area of the substrate, which is then connected by wires with the connection area of the bottom area of the substrate. These areas are then connected with interconnection areas of the bottom area of the substrate. Then the interposer is put on the bottom area of the substrate and its connecting elements are connected with intermediate connection areas of the substrate. Then the cover area of the substrate is folded, which effects that the connection elements of the substrate enter in electronic contact with the aforementioned interconnection areas. Then the inner area of the interposer is filled within an epoxy layer in order to encapsulate the electronic component.

US 2009/065921 A1 discloses a method for receiving electronic components of different sizes in a larger component. In this case, too, an interposer is provided, which has got conductor path structures. This interposer is put around the electronic component and forms in this way a kind of adapter between these components. A capsulation of the electronic component cannot be achieved in this way.

JP 2751518 B2 describes a flexible circuit board, on which semi-conductor elements are provided. The semiconductor board is provided with enlargement plates, each of them having an opening in which electronic components are received. These openings are then filled with resins.

JP 2002009234 A describes a rectangular circuit board, which has got an essentially rectangular basis area, on which mounting areas, which can be folded around the basis area, are joined. On each of these mounting areas a spacer is provided, in the interior of which electronic components are received.

DE 198 00 928 A1 describes a housing for receiving components as well as a method for its production. The housing comprises a cover and a ground plate, whereby the cover and the ground plate are provided by a conductor board in a one-piece arrangement. The conductor board furthermore comprises a flexible area and is bent in this area in such a way that the cover and the ground plate lie one above the other. It is provided that between the cover and the ground plate a space element is arranged, which is formed as a rigid frame. The height of the frame is chosen in such a way that the minimum possible bending radius of the flexible foil, which forms the bottom, the cover and the flexible area lying between these components, is not exceeded and the distance required for receiving components in said housing is achieved. In order to improve the design of said flexible area of the circuit board a spacer is provided on the folding areas with recesses, so that the flexible foil, after folding, does not extend beyond the outer dimensions of the housing and is mechanically shielded.

It is therefore an object of the invention to provide a housing for an electronic module, which allows an improved utilization of the space occupied by the housing according to the invention and allows a simple and therefore cost effective encapsulation of the electronic component accommodated in the housing according to the invention. Furthermore, such an electronic module as well as a method for the manufacturing of said module is to be proposed.

SUMMARY OF THE INVENTION

This object is achieved by the present invention in that at least one lead frame comprising conductor paths is arranged in the housing, wherein at least one conductor path of the lead frame is provided in the bottom part of the housing and at least one further conductor path is provided in the cover part of the housing, and that at least one further conductor path extends, starting from the bottom part of the housing, across the hinge member to the cover part of the housing.

The electronic module according to the invention is characterized in that it uses the afore-described housing according to the invention for an encapsulation of its one or several electronic components.

The inventive method for manufacturing the housing according to the invention for an electronic module provides that for manufacturing the housing a carrier body is used, which comprises a first portion and a second portion and preferably one third portion being arranged between said two portions, wherein the carrier body preferably is formed flexible at least in said third portion, that a lead frame is arranged on said carrier body, and that preferably above the carrier body and the lead frame arranged on it a cover body is arranged, which comprises a first portion and a second portion and preferably a flexible third portion being provided between said two portions, wherein it is provided according to the invention that on the top side of the bottom part and/or on the underside of the cover part a circumferential rim is provided.

By the inventive measures in an advantageous manner a housing is provided, which allows in a simple way an encapsulation of an electronic component of an electronic module. The invention advantageously provides that the bottom part and/or the cover part of the housing can be functionalized, in that in the bottom part and/or in the cover part secondary electronic components like an antenna, displays, etc. are provided. Since, according to the invention, it is provided that in the inventive housing a lead frame having at least one conductor path, which is provided in the bottom part of the housing, at least one further conductor path, which is provided in the cover part of the housing, are provided, wherein at least one conductor path extends, starting from the bottom part of the housing, via the hinge member to the cover part of the housing, an electrically conductive connection between the primary electronic components and the one or more of the aforementioned secondary electronic components is made possible. Such a measure has got the advantage that, as a result, the functionality of an electronic component provided in the housing according to the invention and/or an electronic module using this housing can be increased in an advantageous manner. By providing that according to the invention on the underside of the cover part and/or on the top side of the bottom part a circumferential rim is provided, in an advantageous manner a housing for an electronic module is created, which allows an improved utilization of the space occupied by the housing according to the invention and furthermore a simple and hence cost effective encapsulation of the electronic component accommodated in the housing according to the invention.

An advantageous further development of the invention provides that the housing has at least one carrier body whose first portion forms the bottom part and its second portion the cover part of the housing, wherein it is preferably provided that above the carrier body a cover body is arranged whose first and second portion respectively are arranged above the first and second portions of the carrier body respectively. Such a measure has got the advantage of an especially simple manufacturing of the housing.

A further advantageous development of the invention provides that the carrier body and preferably the cover body comprise a flexible central portion arranged between the respective first and second portion, which, together with the conductor paths of the lead frame extending from the bottom part to the cover part of the housing, form the hinge member.

A further advantageous development of the invention provides that the hinge element is formed by conductor paths of the lead frame. Such a measure has got the advantage of a particularly simple manufacturability of the housing.

A further advantageous development of the invention provides that the bottom part and/or the cover part of the inventive housing comprises at least one contact opening, via which the electronic component accommodated in the housing can be contacted electrically. Such a measure has got the advantage that in this way electronic modules can be arranged one above the other or next to each other. In particular the stacking of several electronic modules using the inventive electronic housing has the advantage that in this way a higher component density on a carrier, in particular a printed circuit board, can be achieved.

The electronic module according to the invention is characterized in that the bottom part and/or the cover part of the housing are functionalized, in that in the bottom part and/or in the cover part one or several secondary electronic components are arranged.

Further advantageous developments of the invention are the subject of the dependent claims.

BRIEF DESCRIPTION OF THE DRAWINGS

Further details and advantages of the invention are disclosed in the exemplary embodiments, which are described in the following with reference to the figures. They show:

FIGS. 1a and 1b are two perspective views of a first exemplary embodiment of a housing for receiving an electronic component, the electronic component is not shown;

FIGS. 2a and 2b are the first exemplary embodiment of the FIGS. 1a and 1b, together with an electronic component accommodated in the housing;

FIGS. 3a to 3c are a plan view, a side view and a bottom view of the first exemplary embodiment in a non-folded state of the housing;

FIGS. 5a to 5e are schematic representations of a manufacturing process of the first exemplary embodiment;

FIGS. 6a and 6b are two perspective views of a second exemplary embodiment of a housing, the electronic component is not shown;

FIGS. 7a and 7b are the second exemplary embodiment of FIGS. 5a and 5b, together with an electronic component inserted in the housing;

FIGS. 8a to 8c are a plan view, a side view and a bottom view of the second exemplary embodiment in a non-folded state of the housing;

FIGS. 10a to 10e are a schematic representation of the manufacturing of the second exemplary embodiment;

FIGS. 11a and 11b are two perspective views of a third exemplary embodiment of a housing, the electronic component is not shown;

FIGS. 12a and 12b are the third exemplary embodiment of FIGS. 11a and 11b, together with an electronic component;

FIGS. 13a to 13c are a top view, a side view and a bottom view of the third exemplary embodiment in a non-folded state of the housing;

FIGS. 14a to 14d are a top view, a section along line A-A of FIG. 14a, a bottom view, and an enlarged view of the portion A of FIG. 14b in a folded state;

FIGS. 15a to 15e are a schematic representation of the manufacturing of the third exemplary embodiment;

FIGS. 16a and 16b are two perspective views of a fourth exemplary embodiment of a housing, the electronic component is not shown;

FIGS. 17a and 17b are the fourth exemplary embodiment of FIGS. 16a and 16b, together with an electronic component;

FIGS. 18a to 18c are a top view, a side view and a bottom view of the fourth exemplary embodiment in a non-folded state of the housing;

FIGS. 20a to 20e are a schematic representation of the manufacturing of the fourth exemplary embodiment;

FIGS. 21a and 21b are two perspective views of a fifth exemplary embodiment of a housing, the electronic component is not shown;

FIGS. 23a to 23c are a top view, a side view and a bottom view of the fifth exemplary embodiment in a non-folded state of the housing;

FIGS. 24a to 24d are a top view, a section along line A-A of FIG. 24a, a bottom view, and an enlarged view of the portion A of FIG. 24b;

FIGS. 25a to 25e are a schematic representation of the manufacturing of the fifth exemplary embodiment;

FIGS. 26a and 26b are a first exemplary embodiment of a multiple arrangement formed of a plurality of electronic modules;

FIGS. 27a and 27b are a second exemplary embodiment of a multiple arrangement formed of a plurality of electronic modules;

FIGS. 28a-28d are perspective views of a sixth exemplary embodiment of a housing, the electronic component is not shown;

FIGS. 29a-29c are a top view, a side view and a bottom view of this sixth exemplary embodiment in a non-folded state of the housing; and FIGS. 30a-30d are a top view, a section along line A-A of FIG. 30a, a bottom view, and an enlarged view of the portion A of FIG. 30b.

DETAILED DESCRIPTION OF THE PREFERRED EMBODIMENTS

Figure 4D:
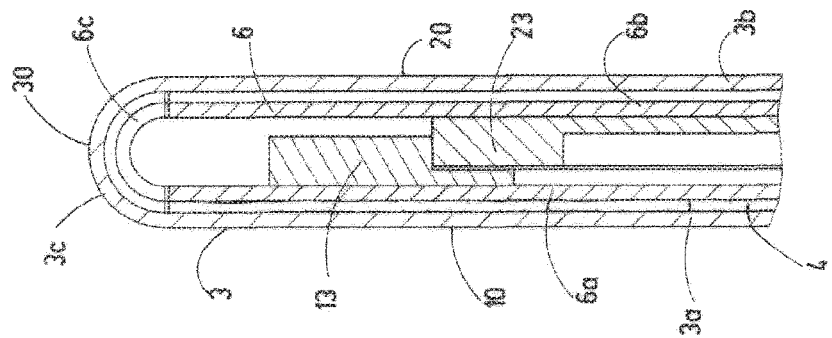
FIGS. 4a to 4d are a plan view, a section along the line A-A of FIG. 4a, a bottom view and an enlarged view of portion A of FIG. 4b in a folded state.
Figure 4C:
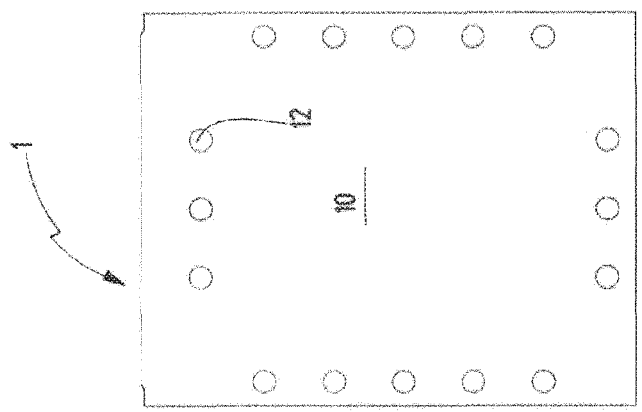
Figure 4B:
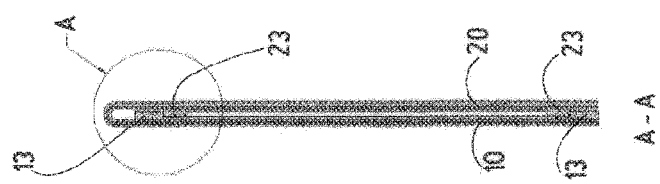
Figure 4A:
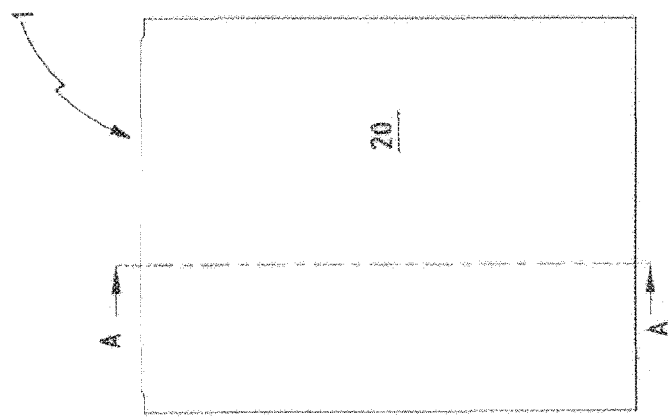
Figure 9D:
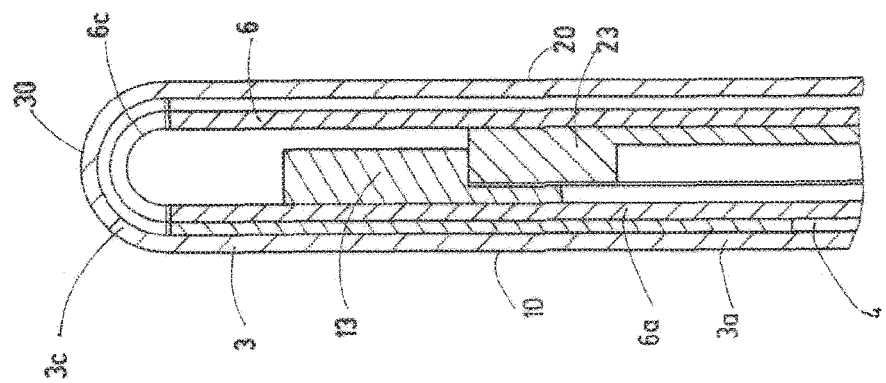
FIGS. 9a to 9d are a top view, a section along the line A-A of FIG. 9a, a bottom view, and an enlarged view of the portion A of FIG. 9b in a folded state.
Figure 9C:
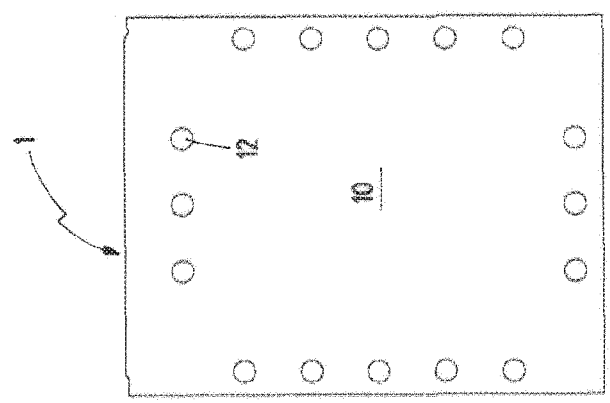
Figure 9B:
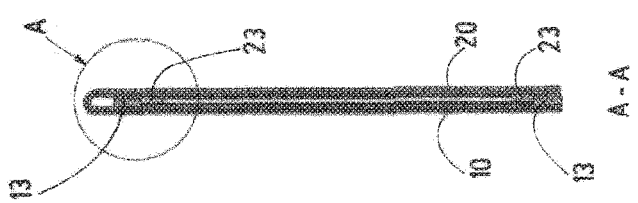
Figure 9A:
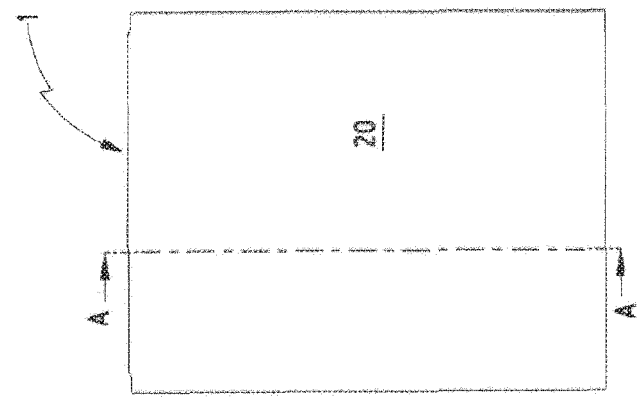

In FIGS. 1a to 5e schematically a first exemplary embodiment of a housing generally designated 1 for an electronic module B, in particular a semiconductor chip (not shown in FIGS. 1a and 1b), is shown, whereby the FIGS. 1a and 1b show a perspective view of the housing 1 in a partially folded state without the electronic component, FIGS. 2*a* and 2*b* show the housing 1 with the electronic component B, FIG. 3*a* shows a top view on the unfolded housing 1, FIG. 3*b* a side view and the FIG. 3*c* a bottom view of the housing 1. FIG. 4*a* shows a top view on the housing 1 in a folded state, FIG. 4*b* a section along the line A-A of FIG. 4*a*, FIG. 4*c* a bottom view of the folded housing 1 and FIG. 4*d* shows an enlarged representation of the portion A of FIG. 4*b*. The further embodiments are shown in the same manner, if there is no indication to the contrary, so that for this embodiments a further explanation of the views contained in the individual figures in detail is not necessary.

The housing 1 comprises a bottom part 10 and a cover part 20, which are connected via a hinge member 30. As it can be seen from FIG. 1, the bottom part 10 of the housing 1 comprises preferably a free space 2, in which the electronic component can be accommodated. In the bottom part 10—as it can be best seen from FIGS. 3*c* and 4*c*—a number of contact openings 12 are provided, through which—as described below—an electric contacting of the electronic component B (see FIGS. 2*a* and 2*b*) accommodated in the housing 1 from its lower contact surface, i.e. from the underside 10*a* of the bottom part 10, is possible. The bottom part 10 comprises a number of connection openings 22, which allow the connection of the electronic component B inserted in the housing 1 via bond wires B'. It is evident for the person skilled in the art that it is possible too to replace the bond wires B' entirely or at least in part by other connecting means; it is, e. g. possible too to connect the electronic component B via a soldering technique, just to mention one of a variety of connecting techniques possible. Since it does not matter how the electronic component B is connected via the connection openings 22, in the following it is assumed for the sake of simplicity that the electronic component B is—as described before—connected via bond wires B'.

Conductor paths 5 of a lead frame 4 extend from the connection openings 22 to the contact openings 12 (see FIGS. 5*b* to 5*e*), so that by means of an electric contacting of the conductor paths 5 through the contact openings 12 via said conductor paths 5 an electrically conductive connection leading to the electronic component B being accommodated in the housing is possible. The bottom part 10 of the housing 1 is provided on its upper side 10*b*, i.e. on its inner side of the housing 1 in its folded state, with a circumferential rim 13. The cover part 20 comprises on its lower side 20*b*, i.e. on its side which is in the folded state of the housing 1 inside thereof, a corresponding circumferential rim 23 which cooperates with the circumferential rim 13 of the bottom part 10 in the closed state of the housing 1: When the housing 1 is closed by folding the cover part 20 around the hinge member 30, the circumferential rim 13 of the bottom part 10 and the circumferential rim 23 of the cover part 20 contact each other, whereby a sealing of the housing 1 in its side portion is achieved.

Further details, and in particular constructive and functional embodiments of the housing 1 are described below with reference to an exemplary manufacturing process of this housing 1 with reference to the FIGS. 5*a* to 5*e*. The aforementioned Figures show the layered structure of the housing 1, which can be seen in FIG. 4*e* too, which comprises a carrier body 3 (FIG. 5*d*) and a cover body 6 (FIG. 5*a*). Between these two layers of the housing 1 the lead frame 4 with conductor paths 5 is arranged. The manufacturing of the housing 1 from the aforementioned components is schematically shown in FIGS. 5*a* to 5*e*, the production of such a multi-layered structure is known per se and hence needs not to be described in detail. FIG. 5*a* shows a top view on a flexible cover body 6 of the housing 1, preferably a flexible foil is used for that purpose. A—in FIG. 5*a* lower—portion 6*a* of said flexible cover body 6 then forms together with a corresponding portion 3*a* of the carrier body 3 the bottom part 10 of the housing 1 and a—in FIG. 5*a* upper—portion 6*b* forms together with an portion 3*b* of the carrier body 3 its cover part 20. The hinge member 30, which connects the bottom part 10 and the cover part 20, is formed by a central portion 3*c* of the carrier body 3 and a portion 6*c* of the cover body 6. It can be seen from FIG. 5*a* that in the first portion 6*a* of the cover body 3 forming the bottom part 10 of the housing 1 the connection openings 22 already have been provided, which—as explained above—enable the electrical connection of the electronic component being accommodated in the housing 1 with the conductor paths 5 of a lead frame 4.

As shown in FIG. 5*b*, on the cover body 6 of the housing 1 the lead frame 4, which is only schematically shown in this figure, is applied, in particular by a lamination technique. Such a procedure is known and therefore needs not be described in detail. Then individual regions of the lead frame 4 are separated in order to form conductor paths 5 (see FIG. 5*c*). These lead from the connection openings 22 (not shown in FIGS. 5*b* and 5*c*) to the contact openings 12 (see FIG. 5*e*) and therefore to the electronic component B accommodated in the housing 1, which, when finally assembling the housing 1 being formed as described and the electronic component to an electronic module, connected by means of an appropriate connection techniques with the conductor paths 5.

The exact design and arrangement of the conductor paths 5 depends on the particular application, in particular on the component being accommodated in the housing 1 and is in generally defined application-specific. This is known too and therefore needs not be described.

FIG. 5*d* now shows a top view on a flexible carrier body 3 of the housing 1, which is arranged for forming the housing 1 above a structure being defined by the cover body 6 and the lead frame 4 arranged on it. It is again preferred that the connection of the carrier body 3 of the housing 1 and the cover body 6 together with the lead frame 4 disposed on it takes place by laminating. The lower portion 3*a* of the carrier body 3 lies above the lower portion 6*a* of the cover body 6 and they together form the bottom part 10 of the housing 1, which is formed in a two-layered manner. In a corresponding way the upper portion 3*b* of the carrier body 3 lies above the upper portion 6*b* of the cover body 6 and they form a—in this embodiment—two-layered cover part 20. The central portion 3*c* of the carrier body 3 lies above the central portion 6*c* of the cover body 6 and they together form the hinge member 30 of the housing 1.

One can see from FIG. 5*d* the contact openings 12 being provided in the carrier body 3, which serve to connect the electronic component accommodated in the housing 1. In the embodiment described here, the conductor paths 5 extend from the connection openings 22 to the contact openings 12 of the bottom part 10 of the housing 1.

FIG. 5*e* now shows a top view on the housing 1 formed as described above, whereby the structures lying under the carrier body 3 are shown in dashed lines.

In a subsequent process step, the circumferential rims 13 and 23 of the bottom part 10 and the cover part 20 of the housing 1 already mentioned before are formed on the inside surface 8*b* of the cover body 6 being inside in the folded state of the housing 1 by applying a structure forming the rims 13 and 23. It is preferred that for forming the rims 13 and 23, a thermosetting plastic is used.

For forming an electronic module then the electronic component, in particular a semiconductor chip, here in particular a naked chip, is introduced in the interior of the housing 1 and its electrical connections are connected with the corresponding connection portions of the housing 1 via an appropriate connection technique, i.e. are connected with the portions of the conductor paths of the lead frame 4 being accessible through the connection openings of the base body 2. Then the cover part 20 is folded around the hinge member 30 onto the bottom part 10 and these two halves of the housing 1 are connected and sealed accordingly. The electronic module formed in this way then can be arranged in a simple manner on an appropriate carrier, in particular a rigid printed circuit board.

The procedure described has got the advantage that in this way in a simple manner a housing 1, which forms an encapsulation for an unhoused electronic component, in particular an unhoused semiconductor chip (naked chip) is provided, which can be manufactured simple and therefore inexpensive. Since the housing 1 can be opened easily at a later point in time, a replacement, e. g. for repair purposes, of an electronic component accommodated in the housing 1 is easily possible.

The described design allows it in an advantageous manner to functionalize the housing 1 for the electronic component in that preferably in the cover part 20 contact elements and/or active and/or passive electronic components are integrated. It is possible in this way that—as it will be described with reference to the following embodiments—e. g. a wireless communication between the electronic component being accommodated in the housing 1 and one or several peripheral devices can be made possible, that in the cover part 20 e. g. display or control elements can be integrated, or that via the contact elements being provided in the cover part 20 a contacting between several electronic modules being formed in this way can be achieved. For a simple distinction of the aforementioned components from the "primary" electronic components being accommodated in the housing 1, the aforementioned contact elements, active and/or passive electronic components being provided in the cover part 20 are referred to as "secondary electronic components" too.

In FIGS. 6a to 10e a second exemplary embodiment of a housing 1 for an electronic module 10 is shown, which corresponds in its basic structure to the one of the first exemplary embodiment. Corresponding components/structures are therefore provided with the same reference numerals and are not described in detail once more. FIGS. 6a and 6b show the second exemplary embodiment of the housing 1 in its open state, FIGS. 7a and 7b show said housing 1 together with an electronic component B, which is connected via bond wires B' in that the bond wires B' are led through the connection openings 22 of the bottom 10 of the housing 1 and are connected with the connection portions of the conductor paths 5 of the lead frame 4 being accessible through said connection openings 22, so that the electronic module 10 is formed. In that regard the structure of the housing 1 of the second embodiment does not differ from that of the first embodiment.

FIG. 8a shows a top view on the folded housing 1 of the second exemplary embodiment, FIG. 8b a section along the line A-A of FIG. 8a, FIG. 8c shows a view of the housing 1 from its contact side and FIG. 8d shows an enlarged representation of detail A of FIG. 8b. One can see from the last mentioned Figures once more the layer-like design of the housing 1 as well as the co-acting of the rims 13 and 23 of bottom part 10 and cover part 20.

The essential difference between the first and the second embodiment is now that in the cover part 20—as a secondary electronic component—an antenna A is integrated, which allows a wireless communication of electronic component B being accommodated in the housing 1 with peripheral devices, and that—as described below—the primary electronic component arranged in the bottom part 10 is connected with the secondary electronic component arranged in the cover part 20 via the lead frame 4.

Figure 10C:
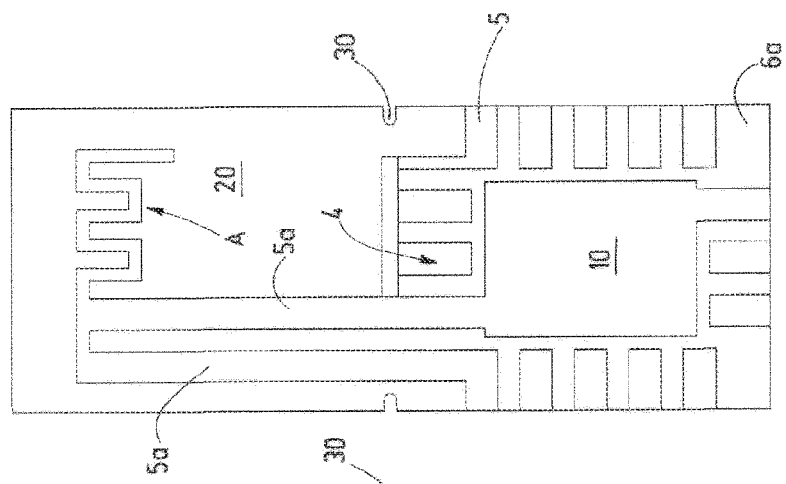
Figure 10B:
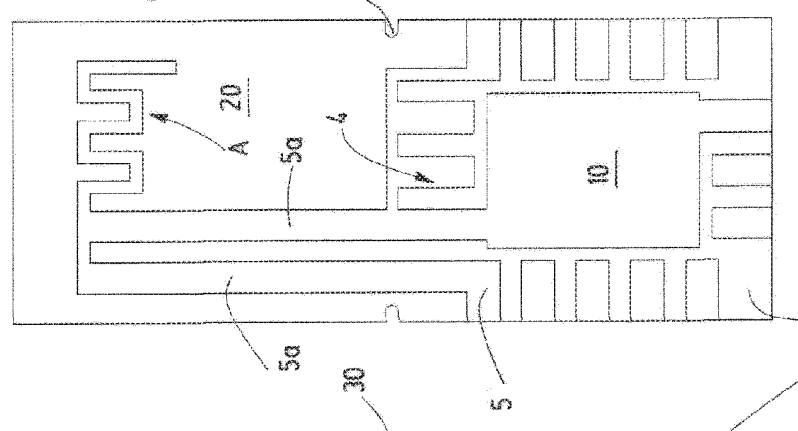
Figure 10A:
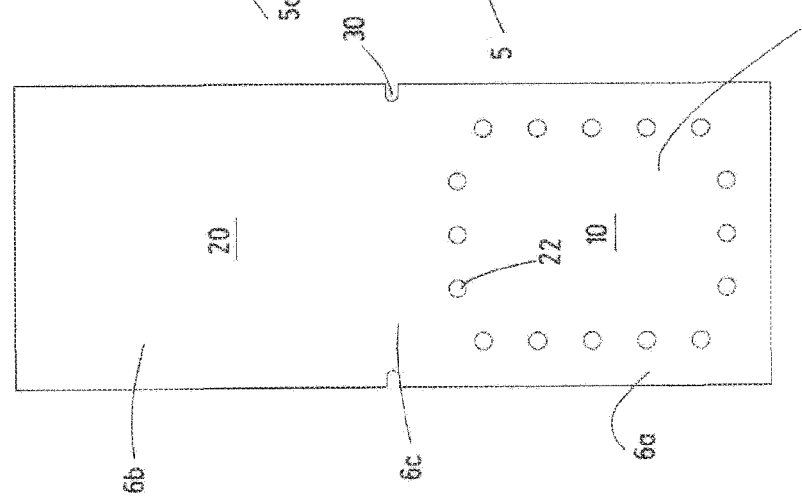

The formation of an electronic module from a housing 1 using said antenna A and the "primary" electronic component B is now described in relation to the manufacturing of the housing 1 of the second embodiment with reference to the FIGS. 10a to 10e. FIG. 10a shows once more the cover body 6 of the housing 1, in so far the manufacturing processes of the first and the second embodiment are the alike. FIG. 10b shows the cover body 6 together with a lead frame 4 being arranged on it, and FIG. 10c shows—corresponding to FIG. 5c—an electrically separated lead frame 4. One can see once again the conductor paths 5 being arranged in the bottom part 10 of the housing 1.

A comparison of FIGS. 10b and 10a and FIGS. 5b and 5c now shows that the lead frame 4 of the second exemplary embodiment now comprises conductor paths 5a, which are provided in the cover part 20 of the housing 1. The conductor paths 5a serve for connecting and/or for forming the antenna A already mentioned before and shown in the figures schematically. One can see that the conductor paths 5a provide an electrically conductive connection between the component B and the antenna A, i.e. a secondary electronic component. The conductor paths 5a of the lead frame 4 extend now, starting from the cover part 20 via the hinge member 30 to the conductor paths 5 of the lead frame 4 in the bottom part 10 of the housing 1. A wireless communication between the component B accommodated in the housing 1 via the antenna A is therefore possible in a simple manner.

The application of the carrier body 3 shown in FIGS. 10d and 10e to the structure formed by the cover body 6 and the lead frame 4 having conductor paths 5 and 5a corresponds to that of the first exemplary embodiment (FIGS. 5d and 5e), so that a renewed description of this process is not necessary any more.

FIGS. 11a to 15e show a third exemplary embodiment of a housing 1 for an electronic component B, whose basic structure corresponds to the one of the first and the second exemplary embodiment, so that corresponding components/structures are provided with the same reference numerals and are not described in detail any more. FIGS. 11a and 11b and 12a and 12b show—corresponding to FIGS. 6a, 6b and 7a, 7b—the housing 1 without and with an electronic component B accommodated therein respectively for forming the electronic module 100. One can see that in the cover part 20 of the housing 1 of the third exemplary embodiment—as secondary electronic components—contact openings 32, which serve—just as the contact openings 12 in the bottom part 10 of the housing 1—to establish, from the upper side 20a of the cover part 20, an electrically conductive contact with the electronic component B received in the housing 1. The cover body 6 of the housing 1 shown in FIG. 15a is formed according to those of the first and second embodiment. One can see the connection openings 22, through which—as in the afore-described exemplary embodiments—via the bond wires B' and the conductor paths 5 of the lead frame 4 an electrical contact with the electronic component B can be made. FIGS. 15b and 15c once more show the lead frame 4 applied onto the cover body 6, whereby the conductor paths 5 of the lead frame 4 once more—as shown in FIG. 15c—have been electrically separated. One can see from FIG. 15c furthermore that the lead frame 4 not only comprises conductor paths 5—as in the first embodiment—in the region of the bottom part 10 of the housing 1, but that—as in the second exemplary embodiment—in the portion of the cover part 20 and the hinge member 30 conductor paths 5b are provided. The conductor paths 5b extend—as the conductor paths 5a of the second embodiment—starting from the cover part 20 across the hinge member 30 to the conductor paths 5 of the lead frame 4 in the bottom part 10 of the housing 1. They serve for the electrically conductive connection of the electronic component B accommodated in the housing 1 with corresponding contact openings 32, the conductor paths 5b therefore extend directly or indirectly from these contact openings 32 via the hinge member 30 to the electronic component B or to bond wires B' extending through the connection openings 22, which connect this electrical component B with the lead frame 4. Insofar the design of the lead frame 4 corresponds to the one of the second embodiment, in which conductor paths 5a are provided, which connect the electronic component B via the hinge member 30 with an antenna A provided in the cover part 20 of the housing 1, but with the provision that the conductor paths 5b of the third exemplary embodiment run to the contact openings 32, so that the conductor paths 5b can be contacted through these openings from the outside electrically. FIG. 15d now shows the carrier body 3 of the housing 1 lying in the mounted states above the cover body 6 and the lead frame 4. One can see that in its upper region 3b, which forms the cover part 20 in the mounted state, there are openings which form the above-mentioned contact openings 32 of the cover part 20.

FIGS. 16a, 16b to 20a to 20e now show a fourth exemplary embodiment of a housing 1 for an electronic module 100, which corresponds in its basic design to the third exemplary embodiment. Corresponding components are therefore provided with the same reference numerals and are not described in detail any more. The essential difference between the third and the fourth exemplary embodiment is that the housing 1 and therefore the electronic module 100 made from the housing 1 and the electronic component B, not only has the above-described contact openings 32, but as a secondary electronic component in addition a display element 70, which is received in a recess 71 of the cover part 20. The manufacturing of the housing 1 and therefore of the electronic component B can once more be seen from FIGS. 20a to 20e and corresponds to the manufacturing of the housing 1 of the third exemplary embodiment, with the provision that in the cover part 20 the display element 70 is provided and that the lead frame 4 comprises a conductor path 5c, which, starting from the bottom part 10 and running across the hinge member 30, leads to that secondary electronic component.

Figure 19A:
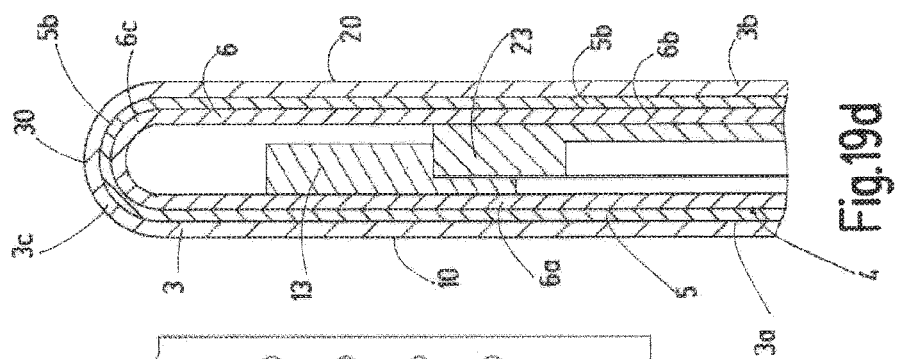
FIGS. 19a to 19d are a top view, a section along line A-A of FIG. 19a, a bottom view, and an enlarged view of the portion A of FIG. 19b.
Figure 19B:
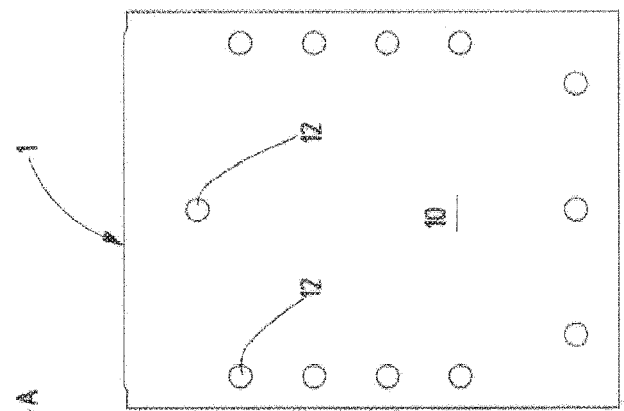
Figure 19C:
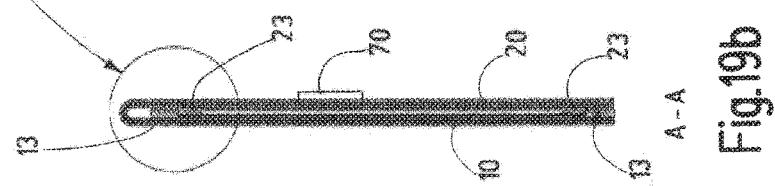
Figure 19D:
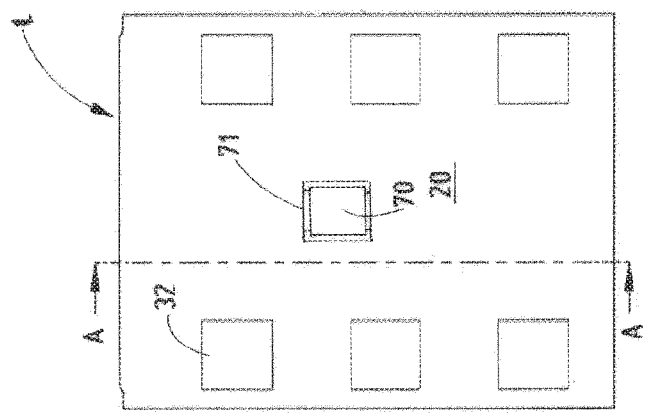
Figure 22A:
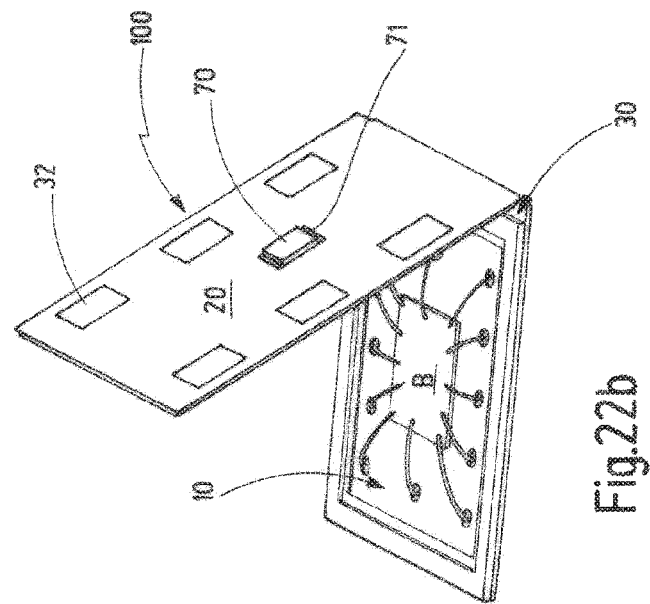
FIGS. 22a and 22b are the fifth exemplary embodiment of FIGS. 21a and 21b, together with an electronic component.
Figure 22B:
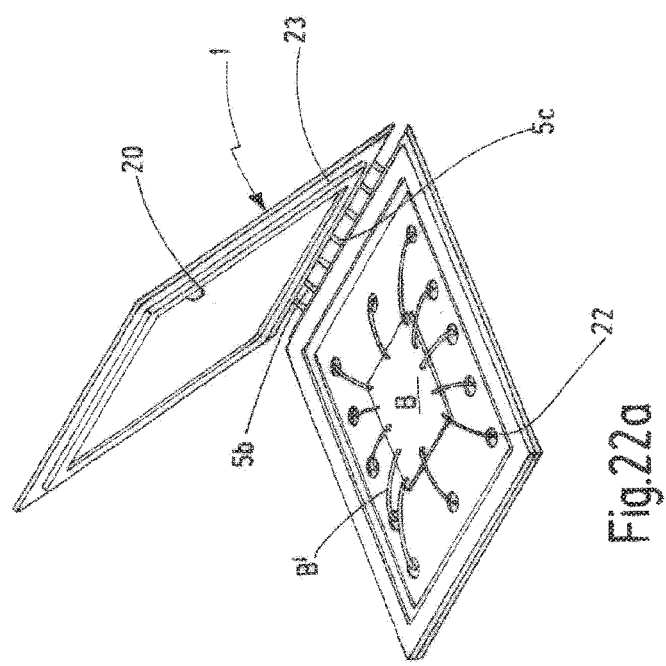

In FIGS. 21a to 25e, a fifth exemplary embodiment of a housing 1 for an electronic module 100 is shown, which corresponds in its basic design to the one of the fourth exemplary embodiment. Corresponding components are therefore provided with the same reference numerals and will not be described once more. The main difference between these two embodiments is in the design of the hinge member 30: While in the fourth exemplary embodiment it is provided that the hinging member 30—as best seen in FIG. 19c—is formed by the central portion 3c of the carrier body 3, the conductor paths 5b, 5c extending from the bottom part 10 to the cover part 20 and the central portion 6c of the cover body 6, it is provided in the hinge member 30 of the fifth exemplary embodiment that the bottom part 10 and the cover part 20 are only connected via the conductor paths 5b, 5c of the lead frame 4. In the fifth exemplary embodiment of the housing 1 consequently the central portions 3c and 6c of the carrier body 3 and the cover body 6 are omitted.

The manufacturing of the housing 1 will be described with reference to FIGS. 25a to 25e. FIG. 25a shows—as the FIG. 20a of the fourth embodiment—a top view on the cover body 6; FIG. 25d shows—like FIG. 20d—a top view on the carrier body 3. As it can be clearly seen from these Figures, the carrier body 3 only comprises the portions 3a and 3b forming the bottom part 10 and the cover part 20 and the cover body comprises corresponding regions 6a and 6b, therefore the central portions 3c and 6c belonging—in the fourth embodiment—to the hinge member 30 are omitted. As it can be seen in particular from FIGS. 21a and 22a, the hinge member 30 of the fifth exemplary embodiment is formed by the conductor paths 5b, 5c of the lead frame 4.

As in the previously described embodiments, the lead frame 4 is placed on the cover body 6 (FIG. 25b) and the individual areas of the lead frame 4 are separated in order to form conductor paths 5 and 5b, 5c, which extend from the bottom part 10 via the hinge element 30 to the cover part 20. The conductor paths 5b serve in the fifth exemplary embodiment—like in the fourth exemplary embodiment—to provide an electrically conductive connection of the electronic component B accommodated in the housing 1 with one or several of the secondary electronic components received in the cover part 20. The further conductor path 5c is provided too, which leads to the display element 70 provided in the cover part 20.

It should be noted in this context that it is not mandatory that each of the conductor paths 5b, 5c of the lead frame 4 which form the hinge member 30 has an electrically conductive function. It is possible too that one or several of the conductor paths 5b, which connect—according to the function of the hinge element 30—the bottom part 10 and the cover part 20 do not serve to connect a secondary component in the cover part 20 with the primary electronic component B directly or indirectly, but only act as a mechanical connection of the cover part 20 and the bottom part 10.

The embodiments described above have the advantage that an electronic component B housed by the described housing 1 can be arranged one above the other in a multiple arrangement and can be connected to one another in the manner of a bus system.

FIGS. 26a, 26b and 27a, 27b show two embodiments of such a stacked arrangement of electronic components B each housed by the housing 1. In FIGS. 16a and 16b a stacked arrangement formed by five electronic modules 100a-100e produced as described before is shown. Here, by way of example, four electronic modules 100a-100e configured as described above are stacked on top of one another, wherein, in this first embodiment, the connection of said modules is achieved by a direct contact of the conductor paths 5 and 5b respectively of the corresponding lead frames 4 of the housings 1 of the electronic modules 100a-100e. For this purpose it is preferred that the conductor paths 5 and 5b respectively of the individual lead frames 4 are designed, in particular embossed, in such a way that in these areas the respective carrier body 3 and the cover bodies 8 respectively extend through the contact openings 12 and 32, so that, by stacking, the conductor paths 5 of the lead frames 4 provided in the bottom part 10 of the housing 1 of adjacent modules contact the conductor paths 5b of the respective overlying module in the area of the contact openings 32 electrically, so that an electrically conductive connection between two adjacent modules is established.

By a stacking an appropriate number of modules a multifunctional assembly can be provided in a simple manner. As an example, a multifunctional sensor is to be mentioned, which allows, e. g. to simultaneously measure the acceleration, the temperature and a pressure. In this case it is preferred that the lowermost module 100a of such a multiple assembly takes care of the communication between such a multiple assembly and a conductor board carrying this multiple assembly and of the power supply. The second electronic module 100b lying above the first electronic module 100a serves to measure the acceleration and contains, as a secondary electronic component, an acceleration sensor. Exemplarily, the third electronic module 100c serves for the measuring of a temperature and contains as a secondary electronic component a temperature sensor. In a corresponding manner the fourth electronic module 100d serves to measure a pressure and contains as a secondary electronic component a pressure sensor. The uppermost electronic module 100e can be used, for example, to control the modules 100a-100d arranged below it.

FIGS. 27a and 27b show a second embodiment of such a multiple assembly, in which again five electronic modules 100a-100e are provided. The difference between these two embodiments of multiple assemblies is that in the second embodiment of the multiple assembly the modules 100a-100e are stacked non-contacting, but are inserted into a holder 60 having contact elements 61, which enter into contact with the lower contact surfaces 22 and the upper contact surfaces 32 of each module.

FIGS. 28a to 30d show a sixth exemplary embodiment of such an electronic module 100. The basic design as well as the manufacturing of the module 100 corresponds to the one of the first five exemplary embodiments, so that corresponding components are denoted with the same reference numerals and are not described in detail. The essential difference between the sixth and the afore-described five exemplary embodiments is given by the design of the contact openings 12, 32. While it was provided in the first five embodiments that the contacting of the electronic component B accommodated in the housing 1 was achieved by contact openings 12, 32, provided in the bottom part 10 of the housing 1 and in the cover part 20 of the housing 1 respectively, this means a contacting from the lower side 1a and the upper side 1b of the housing 1 respectively, in the sixth embodiment a lateral contacting, i.e. a contacting from at least one side face 1c of the housing 1 is provided. One can see in particular from FIG. 28b as well as from FIG. 28d showing a detail A of the first-mentioned figure that the carrier body 3 and the cover body 6 of the housing 1 have lateral recesses 51, so that in these portions corresponding conductor paths 5 of the lead frame 4 are not covered by the carrier body 3 and the cover body 6, so that the conductor paths 5 of the lead frame 4 are accessible in these portions, whereby an electrically contacting can be achieved. In this case, recesses 51 are provided in the carrier body 3 as well as in the cover body 6, so that in the closed state of the housing 1 the conductor paths 5 of the lead frame 4 are accessible from a lateral surface 1c.

It is evident for a person skilled in the art that it is not mandatory that the carrier body 3 as well as the cover body 6 have got corresponding recesses 51. If e. g. the cover body 6 does not have such recesses 51, then the recesses 51 of the carrier body 3 allow a lateral contacting and vice versa.

It is possible too, to combine the afore-described measures, this means that in the sixth embodiment supplementary to the recesses 51 contact openings 12 in the bottom part 10 and/or contact openings 32 in the cover part 20 are provided.

It is apparent for the person skilled in the art from the aforementioned description that, of course, the cover part 20 can be functionalized. The statements made in relation to the first five embodiments apply here accordingly.

In the above description, it was assumed that the carrier body 3 and the cover body 6, whose portions 3a, 6a and 3b, 6b respectively, together form the bottom part 10 and the cover part 20, are formed from a single layer. Again, this is not mandatory. Rather, it is possible to form the carrier body 3 and/or the cover body 6 in a multi-layered way.

The aforementioned description furthermore assumes that the lead frame 4 is put onto the carrier body 3. But this is not mandatory once more. Rather, it is possible that the lead frame 4 is received in the carrier body 3 and the cover body 6 respectively, for example by molding the lead frame 4.

Furthermore, it is possible too that the cover body 6 is omitted. The body part 10 and the cover part 20 respectively are then formed by the corresponding portions 3a and 3b respectively of the carrier body 3.

Furthermore, it is conceivable that the central region 6c is omitted, so that the hinge member 30 is only formed by the central portion 3c of the carrier body 3. The reverse variant, namely, that the hinge member 30 is formed by the flexible portion 6c of the cover body 6 is possible too.

The aforementioned description assumes that the hinge member 30 is formed by the central portion 3c of the carrier body 3 as well as one or several conductor paths 5a, 5b and/or 5c running from the cover part 20 to the bottom part 10. But this is not mandatory. It is possible to omit that central portion 3c of the carrier body 3, so that the hinge member 30 is essentially formed by the conductor paths 5a, 5b, 5c of the lead frame 4.

It is evident for the person skilled in the art from the above description that it is not mandatory to provide rims 13 and 23. In particular in the case of flat electronic components B it is conceivable that these rims 13, 23 are omitted. In order to laterally seal the housing 1 it is preferred that the cover part 20 and the bottom part 10 are glued along their edges.

The aforementioned description assumes that the carrier body 3 is formed as a flexible film. It is not mandatory to form the carrier body 3 continuously as a flexible film. It is sufficient that the carrier body 3 is formed at least in its central portion 3c, i.e. in that portion which forms the hinge member 30, is so flexible that the bottom part 10 and the cover part 20 can be folded onto each other about this hinge member 30. The same applies for the cover body 6. Here, too, it is sufficient that this is sufficiently flexible in its central region 6c, which, together with the central portion 3c of the carrier body 3, forms the hinge member 30.

It is apparent to those skilled in the art from the foregoing description that it is not mandatory that in the housing 1 only one primary electronic component and/or one secondary electronic component is provided. Of course it is possible that several primary electronic components and/or secondary electronic components are provided in the housing 1, which are then connected by conductor paths 5, 5a, 5b, 5c of the lead frame 4. Furthermore, it is possible that in the housing 1 electronic components are present which are not connected by the lead frame 4.

Of course, all of the above described measures can be combined with each other.

In summary, it should be noted that by the measures described a housing 1 is formed, which allows in a simple manner an encapsulation of an electronic component. It is of advantage that the housing 1 allows a functionalization of the cover part 20 and/or the bottom part 10 of the housing 1, so that in the cover part 20 and/or in the bottom part 10 secondary electronic components like an antenna, sensors, display elements, contact elements, etc. can be provided, which cooperate with the electronic component B accommodated in the housing 1. By providing contact surfaces 32 in the cover part 20 of the housing 1 and/or in at least one lateral face 1*c* thereof in a simple manner is achieved that several electronic modules 100, 100*a*-100*e* being made of a housing 1 and an electronic component received therein can be stacked one above the other or laterally, wherein in particular the superimposition of several electronic modules 100, 100*a*-100*e* formed as described before allow a higher component density on an electronic circuit board receiving several electronic modules 100, 100*a*-100*e*.

What is claimed is:

1. A housing for accommodating an electronic component of an electronic module, the housing comprising:
    a bottom part and a cover part;
    wherein the bottom part and the cover part are connected by a hinge member and the bottom part and the cover part of the housing can be folded onto each other by the hinge member;
    wherein in the housing at least one lead frame comprising conductor paths is arranged, wherein at least one conductor path of the lead frame is provided in the bottom part of the housing and at least one further conductor path is provided in the cover part of the housing, and wherein said at least one further conductor path extends from the bottom part of the housing via the hinge member to the cover part of the housing;
    wherein for sealing the housing, the bottom part of the housing comprises a circumferential rim arranged on its top side and the cover part of the housing comprises on its underside a circumferential further rim, wherein when the housing is closed by folding the cover part about the hinge member, the circumferential rim of the bottom part and the further circumferential rim of the cover part are in contact with each other, thereby sealing the housing and sealing the electronic component of the electronic module to be disposed therein.

2. The housing according to claim 1, wherein the housing comprises at least one carrier body, having a first portion and a second portion, said first portion forming the bottom part and said second portion forming the cover part of the housing.

3. The housing according to claim 1, wherein the carrier body comprises a central portion arranged between the first portion and the second portion, wherein said carrier body is formed flexible at least in its central portion.

4. The housing according to claim 1, wherein above the carrier body a cover body is arranged, whose first portion together with the first portion of the carrier body forms the bottom part of the housing, and whose second portion together with the second portion of the carrier body forms the cover part.

5. The housing according to claim 1, wherein the cover body comprises a central portion arranged between the first portion and the second portion.

6. The housing according to claim 1, wherein the hinge member comprises at least one conductor path.

7. The housing according to claim 1, wherein at least one of the carrier body and the cover body is formed multi-layered.

8. The housing according to claim 1, wherein at least one of the bottom part and the cover part comprises at least one contact opening, by which the electronic component accommodated in the housing can be electrically contacted.

9. The housing according to claim 1, wherein in at least one of the cover part and the bottom part of the housing at least one secondary electronic component, comprising an antenna, a display element, or a sensor, is provided.

10. An electronic module, comprising at least one electronic component, which is accommodated in a housing, the housing comprising:
    a bottom part and a cover part;
    wherein the bottom part and the cover part are connected by a hinge member and the bottom part and the cover part of the housing can be folded onto each other by the hinge member;
    wherein in the housing at least one lead frame comprising conductor paths is arranged, wherein at least one conductor path of the lead frame is provided in the bottom part of the housing and at least one further conductor path is provided in the cover part of the housing, and wherein said at least one further conductor path extends from the bottom part of the housing via the hinge member to the cover part of the housing;
    wherein for sealing the housing, the bottom part of the housing comprises a circumferential rim arranged on its top side and the cover part of the housing comprises on its underside a circumferential further rim, wherein when the housing is closed by folding the cover part about the hinge member, the circumferential rim of the bottom part and the further circumferential rim of the cover part are in contact with each other, thereby sealing the housing and sealing the electronic component of the electronic module to be disposed therein.

11. The electronic module according to claim 10, wherein said electronic component is at least one primary electronic component and provided in at least one of the bottom part and the cover part, and at least one secondary electronic component is provided in at least one of the cover part and the bottom part, and that said at least one primary electronic component and said at least one secondary electronic component are connected via conductor paths of the lead frame provided in the housing.

12. A method for manufacturing a housing for the electronic module according to claim 1, wherein for manufacturing said housing a carrier body is used, which has a first portion and a second portion, and that on or in said carrier body the at least one lead frame is arranged, wherein for sealing the housing, on the bottom part a circumferential rim arranged on its top side is provided and/or on the cover part of the housing a circumferential further rim arranged on its underside is provided.

13. The method according to claim 12, wherein the carrier body comprises a central portion being arranged between the first portion and the second portion, and that the carrier body is provided flexible at least in said central portion.

14. The method according to claim 13, wherein above the carrier body and the lead frame being arranged on or in it a cover body is provided, which has the first portion and the second portion as well preferably a flexible central portion being arranged between said portions.

* * * * *